US012336268B2

United States Patent
Thomas et al.

(10) Patent No.: US 12,336,268 B2
(45) Date of Patent: Jun. 17, 2025

(54) GALLIUM NITRIDE (GaN) INTEGRATED CIRCUIT TECHNOLOGY

(71) Applicant: Intel Corporation, Santa Clara, CA (US)

(72) Inventors: Nicole K. Thomas, Portland, OR (US); Samuel Bader, Hillsboro, OR (US); Marko Radosavljevic, Portland, OR (US); Han Wui Then, Portland, OR (US); Pratik Koirala, Portland, OR (US); Nityan Nair, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 776 days.

(21) Appl. No.: 17/402,054

(22) Filed: Aug. 13, 2021

(65) Prior Publication Data

US 2023/0047449 A1    Feb. 16, 2023

(51) Int. Cl.
*H01L 27/06*    (2006.01)
*H01L 21/02*    (2006.01)
*H01L 29/06*    (2006.01)
*H01L 29/20*    (2006.01)
*H01L 29/40*    (2006.01)
*H01L 29/423*   (2006.01)
(Continued)

(52) U.S. Cl.
CPC ....... *H10D 84/01* (2025.01); *H01L 21/02381* (2013.01); *H01L 21/0243* (2013.01); *H01L 21/0254* (2013.01); *H10D 30/43* (2025.01); *H10D 30/475* (2025.01); *H10D 30/6735* (2025.01); *H10D 30/6743* (2025.01); *H10D 30/6757* (2025.01); *H10D 62/121* (2025.01); *H10D 62/8503* (2025.01); *H10D 64/111* (2025.01)

(58) Field of Classification Search
CPC .......... H01L 27/0605; H01L 21/02381; H01L 21/0243; H01L 21/0254; H01L 29/0673; H01L 29/2003; H01L 29/402; H01L 29/42392; H01L 29/775; H01L 29/7786; H01L 29/78651; H01L 29/78696; H01L 29/785; H01L 21/8258; H01L 21/823807; H01L 29/1079; H01L 27/0688; H01L 29/78645; H01L 29/78681; H01L 29/0847; H01L 29/1066; H01L 29/4236; H01L 29/7831; B82Y 10/00
USPC .......................................................... 257/76
See application file for complete search history.

(56) References Cited

U.S. PATENT DOCUMENTS

2015/0228480 A1*  8/2015  Yin ................... H01L 29/78696
                                                             438/283
2020/0227544 A1*  7/2020  Then .................. H01L 29/7786

FOREIGN PATENT DOCUMENTS

WO    WO-2018169519 A1 *  9/2018

* cited by examiner

*Primary Examiner* — Tong-Ho Kim
(74) *Attorney, Agent, or Firm* — Schwabe, Williamson & Wyatt P.C.

(57) ABSTRACT

Gallium nitride (GaN) integrated circuit technology is described. In an example, an integrated circuit structure includes a substrate including silicon, the substrate having a top surface. A first trench is in the substrate, the first trench having a first width. A second trench is in the substrate, the second trench having a second width less than the first width. A first island is in the first trench, the first island including gallium and nitrogen and having first corner facets below the top surface of the substrate. A second island is in the second trench, the second island including gallium and nitrogen and having second corner facets below the top surface of the substrate.

19 Claims, 14 Drawing Sheets

(51) Int. Cl.
*H01L 29/775* (2006.01)
*H01L 29/778* (2006.01)
*H01L 29/786* (2006.01)
*H10D 30/43* (2025.01)
*H10D 30/47* (2025.01)
*H10D 30/67* (2025.01)
*H10D 62/10* (2025.01)
*H10D 62/85* (2025.01)
*H10D 64/00* (2025.01)
*H10D 84/01* (2025.01)

GALLIUM NITRIDE (GaN) INTEGRATED CIRCUIT TECHNOLOGY

TECHNICAL FIELD

Embodiments of the disclosure are in the field of advanced integrated circuit structure fabrication and packaging and, in particular, gallium nitride (GaN) integrated circuit technology.

BACKGROUND

Power delivery and RF communication are essential to every compute solution. Si and III-V technologies are facing fundamental limits in power and RF. Future compute solutions will require a better semiconductor technology to continue to deliver better energy efficiencies, better performance, and more functionalities in smaller form factors. Two industry trends are converging to transform power delivery and RF: 300 mm gallium nitride (GaN)-on-Si and monolithic 3D ICs. Amongst semiconductor technologies today, GaN is best for power delivery and RF due to its wide bandgap qualities. Monolithic 3D integration is a powerful way to integrate dissimilar best-in-class semiconductor technologies on the same silicon to deliver the best performance, improved density, and more functionalities.

DESCRIPTION OF THE EMBODIMENTS

Figure 1A:
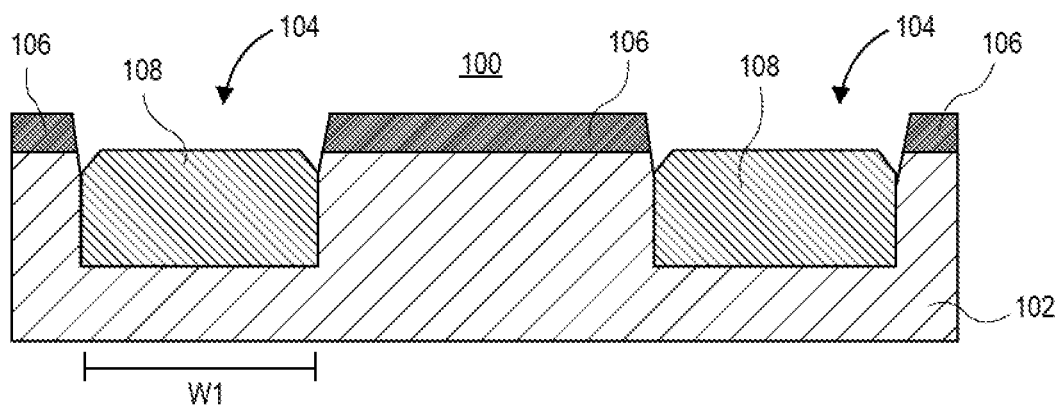
FIGS. 1A-1E illustrate cross-sectional views representing various operations in a method of fabricating differing aspect ratio GaN islands in trenches in a silicon substrate, in accordance with an embodiment of the present disclosure.

Gallium nitride (GaN) integrated circuit technology is described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions or context for terms found in this disclosure (including the appended claims):

"Comprising." This term is open-ended. As used in the appended claims, this term does not foreclose additional structure or operations.

"Configured To." Various units or components may be described or claimed as "configured to" perform a task or tasks. In such contexts, "configured to" is used to connote structure by indicating that the units or components include structure that performs those task or tasks during operation. As such, the unit or component can be said to be configured to perform the task even when the specified unit or component is not currently operational (e.g., is not on or active). Reciting that a unit or circuit or component is "configured to" perform one or more tasks is expressly intended not to invoke 35 U.S.C. § 112, sixth paragraph, for that unit or component.

"First," "Second," etc. As used herein, these terms are used as labels for nouns that they precede, and do not imply any type of ordering (e.g., spatial, temporal, logical, etc.).

"Coupled"—The following description refers to elements or nodes or features being "coupled" together. As used herein, unless expressly stated otherwise, "coupled" means that one element or node or feature is directly or indirectly joined to (or directly or indirectly communicates with) another element or node or feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation or location or both of portions of the component within a consistent but arbitrary frame of reference which is made clear by reference to the text and the associated drawings describing the component under discussion. Such terminology may include the words specifically mentioned above, derivatives thereof, and words of similar import.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, or effect which might otherwise occur. Accordingly, when a component, element, or feature is referred to as inhibiting a result or state, it need not completely prevent or eliminate the result or state.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back-end-of-line (BEOL) semiconductor processing and structures. BEOL is the second portion of IC fabrication where the individual devices (e.g., transistors, capacitors, resistors, etc.) get interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

In accordance with embodiments of the present disclosure, monolithic 3D integration of GaN NMOS and Si CMOS enables full integration of energy-efficient, truly compact power delivery and RF solutions with CMOS digital signal processing, logic computation and control, memory functions and analog circuitries for next generation power delivery, RF (5G and beyond) and SoC applications.

Inflection points: (a) Today, products are pushing the envelope of power delivery towards 2000 W and beyond. This demands compact high power solutions that only GaN 3D IC can provide. Power delivery experts can now be empowered to re-think the entire power delivery chain from 48V-to-1V, from servers to clients, how to achieve higher efficiencies as well as higher frequencies to shrink inductor size. (b) Emergence of new communication standards at ever higher frequencies and larger bandwidths, e.g. WiFi 7, and convergence of 5G wireless and WiFi, demand cost effective, efficient and compact high-power RF frontend solutions that only 300 mm GaN 3D IC can provide. In a 5G basestation/picocell, a phase array solution based on Si or SiGe technology would require >1000 RF power amplifiers (PAs) to produce the same RF output power that can be achieved with about 100 GaN RF PAs. Moreover, the phase array based on GaN 3D IC could be about 10× cheaper and consume up to about 35% less power.

Customers will require compact, efficient power and RF solutions along with compute solutions. 300 mm GaN 3D IC offers high power delivery and RF output at high frequency which no other technology can deliver. It is about 50× cheaper than today's 4" GaN-on-SiC, 30-50% more efficient and about 10× smaller than Si/III-V technologies. Before GaN 3D IC, there is not one technology that can meet the diverse needs of RF frontends. These solutions come in multiple separate chips that must be made to work together in a bulky package. With GaN 3D IC, single-chip RF frontend solutions can be enabled that integrates all these functionalities onto a single die. Therefore, GaN 3D IC could enable features that were not possible before, for e.g., tiny power delivery chiplets, and fully integrated RF FE for 5G picocells and basestation.

Co-integration of GaN power transistors with Si CMOS can be readily detected by conventional cross-section and/or material analysis techniques. For example, Transmission Electron Microscopy (TEM)) can be used to identify 3D structural arrangements of GaN and Si transistors. Electron Energy Loss Microscopy (EELS) can be used to identify elemental composition of transistor channels to show the presence of Ga and Si in the transistors.

In a first aspect, integration of GaN islands of different sizes on silicon (Si) substrates, e.g., for GaN CMOS applications, is described.

To provide context, CMOS functionality can be provided to a GaN system for RF and power applications. Co-integration of GaN and Si on the same wafer for parallel transistor fabrication on both GaN islands and the Si wafer can enable such systems. However, GaN growth rate in Si trenches is highly dependent on the feature size. In order to integrate different size GaN islands, a new approach for integration is needed. Additionally, currently, no solution exists to integrate both NMOS and PMOS on GaN since GaN supports NMOS only at this point. Also, there are no known solutions for addressing the trench growth issue.

To provide further context, GaN-based CMOS may have to rely on GaN NMOS and Si PMOS planar device structures. Co-integration of GaN and Si devices can be limited by different growth rates of GaN depending on trench size. Future layouts may require different GaN island sizes to be enabled.

In accordance with one or more embodiments of the present disclosure, a multi-cycle trench etch plus GaN growth is implemented to enable integration of GaN islands of multiple sizes. A sequential trench etch and growth technique is utilized to fill differently sized trenches during different GaN epitaxial growth cycles to enable a same growth thickness for different feature sizes. Embodiments can be implemented to provide CMOS functionality for the GaN RF applications utilizing 300 mm fabrication techniques. Embodiments can be implemented to allow more flexibility in circuit layouts with different GaN island feature sizes.

In an embodiment, GaN grows with distinct facets at the surface. In a multi-cycle processing sequence of, e.g., hard-mask (HM) deposition/HM patterning/trench etch/GaN growth), such facets can be filled with HM material in the subsequent cycles and or other inter-layer dielectrics (ILDs) to planarize the whole wafer prior to transistor fabrication. In one embodiment, different trench aspect ratio (AR) islands can exhibit different faceting. In one embodiment, differing island sizes have a same GaN surface which is flush with a Si substrate. In one embodiment, HM material remains in corners of trenches, even in the final product.

In an exemplary processing scheme, FIGS. 1A-1E illustrate cross-sectional views representing various operations in a method of fabricating differing aspect ratio GaN islands in trenches in a silicon substrate, in accordance with an embodiment of the present disclosure.

Referring to FIG. 1A, a starting structure 100 includes a substrate 102, such as a monocrystalline silicon substrate, having trenches 104 etched therein. Each trench 104 is a relatively wide trench having a first width, W1. A hardmask 106, such as a silicon nitride hardmask, is on a top surface of the substrate 102, exposing the trenches 104. A relatively wide GaN island 108 is formed in corresponding ones of the trenches 104. In one embodiment, each GaN island 108 has corner facets and has a top surface co-planar with the top surface of the substrate 102, as is depicted.

Figure 1B:
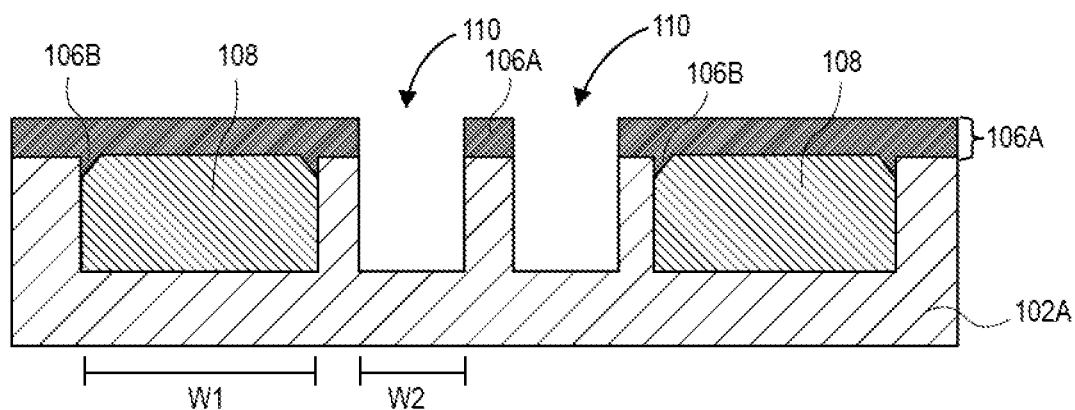

Referring to FIG. 1B, additional hardmask material is added to hardmask 106 or a new hardmask layer replaces hardmask 106 to form hardmask 106A. In one embodiment, hardmask material portions 106B fill in voids created by the corner facets of each GaN island 108. Trenches 110 are etched in the substrate 102, forming substrate 102A. Each trench 110 is a relatively narrow trench having a second width, W2. Hardmask 106A is on the top surface of the substrate 102A, exposing the trenches 110.

Figure 1C:
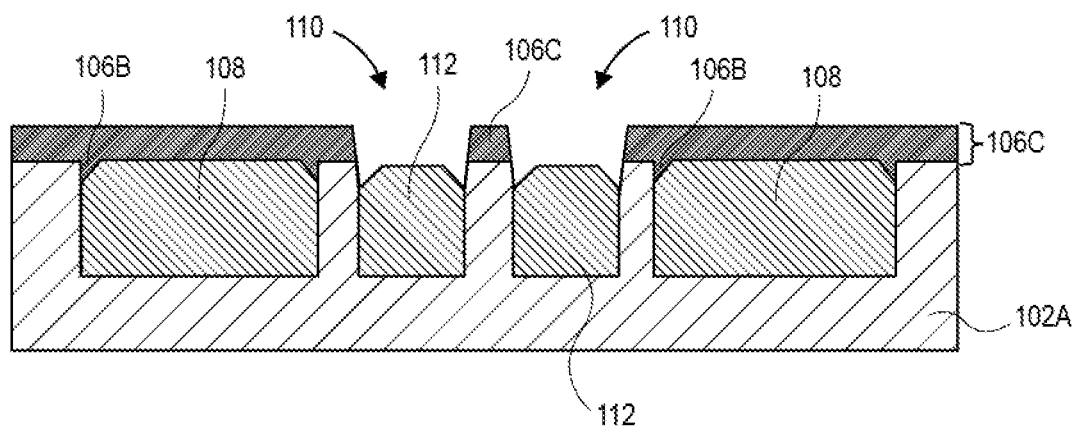

Referring to FIG. 1C, a relatively narrow GaN island 112 is formed in corresponding ones of the trenches 110. In one embodiment, each GaN island 112 has corner facets and has a top surface co-planar with the top surface of the substrate 102A, as is depicted. In one embodiment, the deposition process can slightly erode the edges of hardmask 106A to form hardmask 106C, as is depicted.

Figure 1D:
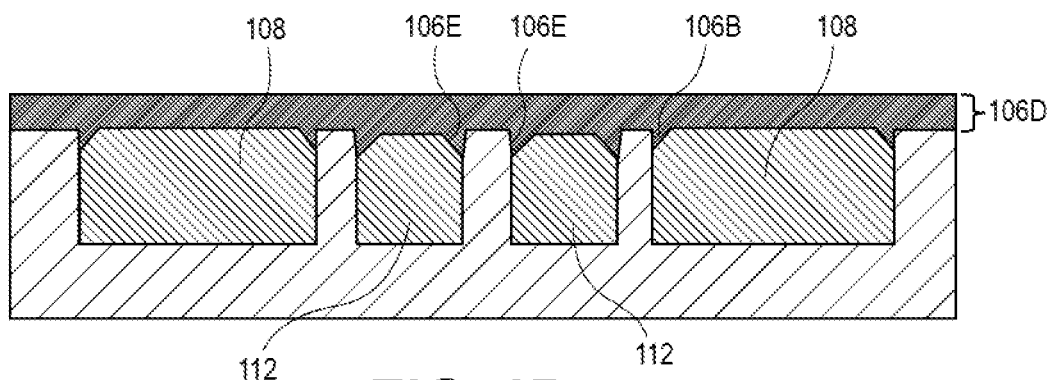

Referring to FIG. 1D, additional hardmask material is added to hardmask 106C or a new hardmask layer replaces hardmask 106C to form hardmask 106D. In one embodiment, hardmask material portions 106E fill in voids created by the corner facets of each GaN island 112.

Figure 1E:
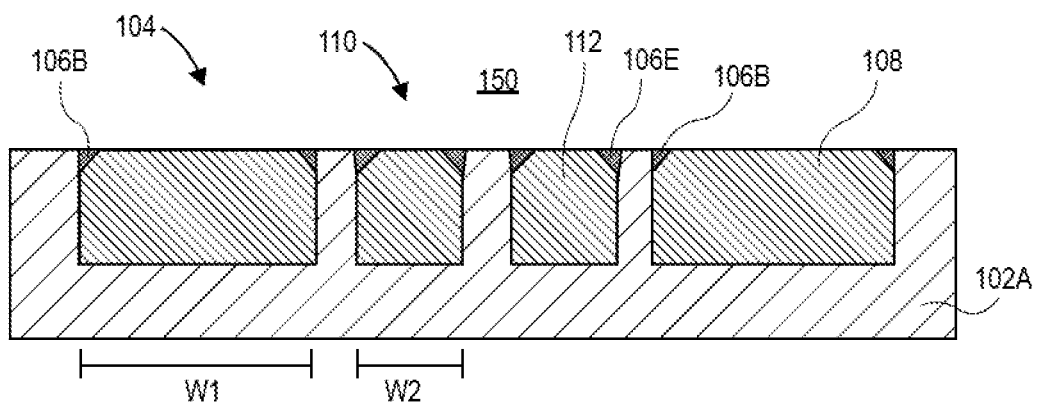

Referring to FIG. 1E, the hardmask 106D is planarized to expose the top surface of substrate 102A. In one embodiment, the planarization process leaves hardmask material portions 106B in the voids created by the corner facets of the GaN islands 108, and leaves hardmask material portions 106E in the voids created by the corner facets of the GaN islands 112.

With reference again to FIG. 1E, in accordance with an embodiment of the present disclosure, an integrated circuit structure 150 includes a substrate 102A including silicon, the substrate 102A having a top surface. A first trench 104 is in the substrate 102A. The first trench 104 has a first width, W1. A second trench 110 is in the substrate. The second trench 110 has a second width less than the first width. A first island 108 is in the first trench 104. The first island 108 includes gallium and nitrogen and has first corner facets below the top surface of the substrate 102A, as is depicted. A second island 112 is in the second trench 110. The second island 112 includes gallium and nitrogen and has second corner facets below the top surface of the substrate, as is depicted.

In one embodiment, the first width, W1, is greater than the second width W2, by approximately 10% or more. In one embodiment, the first width, W1, is greater than the second width W2, by approximately 50% or more. In one embodiment, the first width, W1, is greater than the second width W2, by approximately 100% or more. In an embodiments, either of the trench widths is in the range of 200 nm to 25 microns. In an embodiment, either of the trench depths is in the range of 50 nm to 1 micron.

In one embodiment, the integrated circuit structure 150 further includes a hardmask material 106B/106E adjacent to the first corner facets and the second corner facets. In one such embodiment, the hardmask material 106B/106E includes silicon and nitrogen. In one embodiment, the first island 108 has a top surface co-planar with the top surface of the substrate 102A, and the second island 112 has a top surface co-planar with the top surface of the substrate 102A, as is depicted.

In accordance with one or more embodiments of the present disclosure, a GaN device is fabricated on the first island 108 or the second island 112. In a particular embodiment, one or more high voltage scaled GaN devices are fabricated on the first island 108 or the second island 112, examples of which are described below.

To provide context, RF power amplifiers (RF PAs) are needed to transmit RF signals between mobile devices and base stations located at far distances away, such as greater than 1 mile. The efficiency of these RF PAs is a key determinant of battery life in mobile handsets and power consumption (cost) in RF base stations. Good linearity of the RF power amplifier is required for modern communication standards such as 4G LTE and 5G standards. RF PAs typically operate at several dB back-off from its saturated mode in order to meet the linearity requirements. Thus, the efficiency suffers and in most PAs, it may degrade by a factor of 2-3×.

Due to its wide bandgap and high critical breakdown electric field, gallium nitride (GaN) transistors are considered for high voltage applications such as power converters, RF power amplifiers, RF switch and high voltage applications. Simple transistor architecture, namely, having a single gate, source and drain, falls short of realizing the full potential of GaN in achieving the maximum breakdown voltage as dictated by its material properties. This is because the drain electric field concentrates at the edge of the gate and causes premature breakdown.

Embodiments of the present disclosure relate to gallium nitride (GaN) transistors having drain field plates. In embodiments, the transistors of the present disclosure have a gallium nitride (GaN) layer disposed above a substrate. A gate structure is disposed above the GaN layer. A source region and a drain region are disposed on opposite sides of the gate structure. The drain field plate may be biased to an electrical potential which is different than a gate voltage and/or VSS offering a greater degree of control of the drain field. The transistors of the present disclosure may enable new circuit architectures, such as a cross-coupled pairs. Additionally, the distance the drain field plate extends above the drain can be independently adjusted to improve the effect the field plate has on the drain field distribution, and hence increase breakdown voltage and linearity. In an embodiment, the transistor is operated in an enhancement mode. In an embodiment the gate structure may have a "T" shape in order to reduce the electrical resistance of the gate structure. In an embodiment, the transistor may include a second gate structure or multiple gate structures disposed between the gate structure and the drain field plate to provide a multigate switch for, for example, an RF voltage divider.

Figure 2:
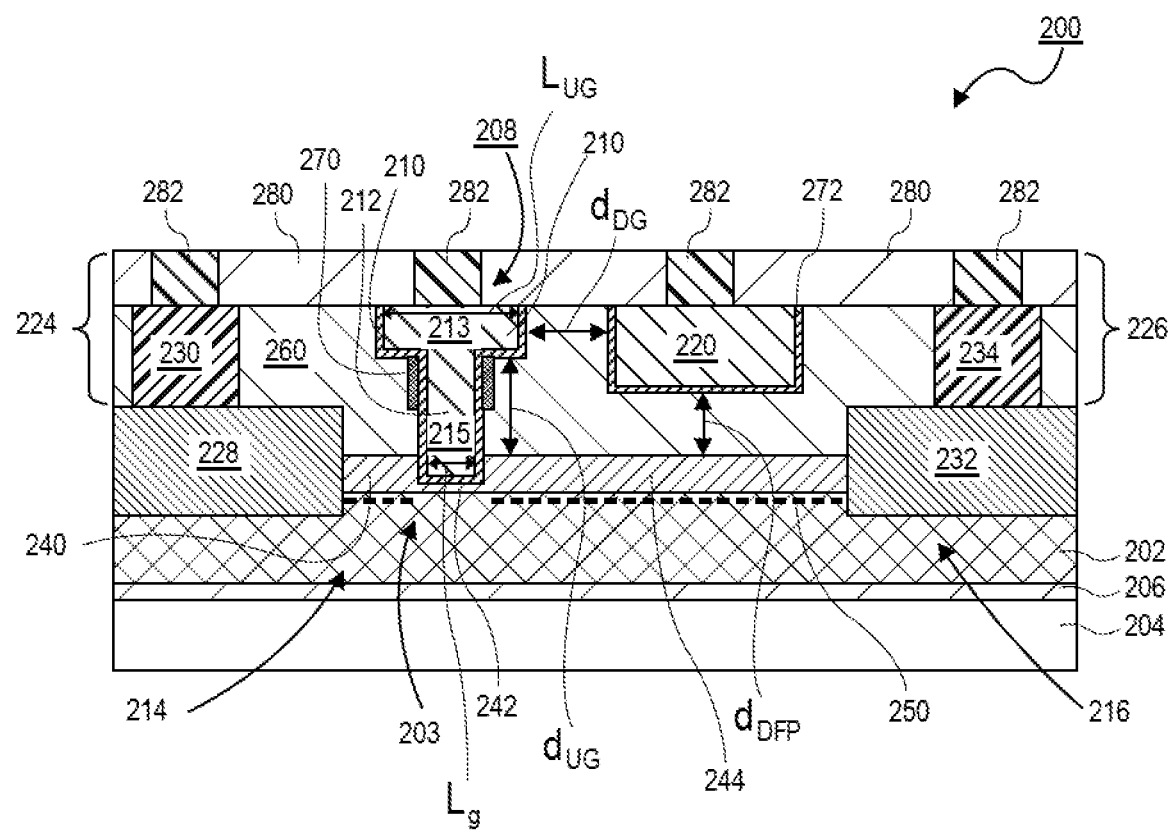
FIG. 2 illustrates a cross-sectional view of a transistor having a drain field plate, in accordance with embodiments of the present disclosure.

FIG. 2 illustrates as transistor 200 having a drain field plate in accordance with embodiments of the present disclosure. Transistor 200 includes a GaN layer 202 disposed above a substrate 204. A buffer layer 206 may be disposed between GaN layer 202 and substrate 204. A gate structure 208 is disposed above GaN layer 202 as illustrated in FIG. 2. Gate structure 208 may include a gate dielectric 210, such as a high k gate dielectric, such as but not limited to hafnium oxide (e.g., $HfO_2$) and aluminum oxide (e.g., $Al_2O_3$), and a gate electrode 212, such as a metal gate electrode. A source region 214 and a drain region 216 are disposed on opposite sides of gate structure 208 as illustrated in FIG. 2.

Transistor 200 includes a drain field plate 220 located above drain region 216. Drain field plate 220 is separated from drain region 216 by a distance ($d_{DFP}$) as illustrated in FIG. 2. Drain field plate 220 may be separated from gate structure 208 by a distance dDG.

In an embodiment, source region 214 includes a source contact 224 and drain region 216 includes a drain contact 226. Source contact 224 may include a source semiconductor contact 228 and a source metal contact 230, and drain contact 226 may include a drain semiconductor contact 232 and a drain metal contact 234. In an embodiment as illustrated in FIG. 2, source semiconductor contact 228 and drain semiconductor contact 232 are formed from a group III-N semiconductor, such as but not limited to indium gallium nitride (InGaN). In an embodiment, the group III-N semiconductor has an N+ conductivity, such as, for example, containing Si dopant density greater than $1 \times 10^{18}$ atoms/cm$^3$. In an embodiment, the source metal contact 230 and the drain metal contact 234 include a metal, such as but not limited to titanium. In an embodiment, drain field plate 220 is located laterally between drain metal contact 234 and gate structure 208 as shown in FIG. 2.

Transistor 200 may include a polarization layer 240 disposed on GaN layer 202. Polarization layer 240 may be formed from a group III-N semiconductor, such as but not limited to aluminum gallium nitride (AlGaN), aluminum indium nitride (AlInN), aluminum indium gallium nitride (AlInGaN) and indium gallium nitride (InGaN). In an embodiment, polarization layer 240 is sufficiently thick in order to create a two-dimensional electron gas (2 DEG) effect or layer 250 in the top surface of GaN layer 202 as illustrated in FIG. 2. In an embodiment, polarization layer 240 has a portion 242 beneath gate structure 208 which is thinner than portion 244 above source region 214 and drain region 216 so that a 2 DEG layer or effect is not created in gallium nitride layer 202 beneath gate structure 208 as shown in FIG. 2. In an embodiment, polarization layer 240 is completely removed from under gate structure 208 and gate structure 208 is disposed directly on GaN layer 202. In an embodiment polarization layer 240 is multilayer film including a lower AlN film and an upper AlInN for example. In an embodiment, transistor 200 is operated in an enhancement mode.

Drain field plate 220 and gate structure 208 are disposed within dielectric layer 260 as illustrated in FIG. 2. In an embodiment, the top surface of drain field plate 220, is coplanar with the top surface of gate structure 208 as illustrated in FIG. 2. In an embodiment, the top surface of dielectric layer 260 is coplanar with the top surface of gate structure 208, and drain field plate 220 as illustrated in FIG. 2. In an embodiment, the top surface of source metal contact 230 and the top surface of drain metal contact 234 are coplanar with the top surface of gate structure 208 and the top surface of drain field plate 220.

Transistor 200 has a gate length ($L_g$) in a first direction extending between the source region 214 and the drain region 216 as shown in FIG. 2. A channel region is located in GaN layer 202 beneath gate structure 208 and between source region 214 and drain region 216. Transistor 200 has a gate width (Gw) in a direction perpendicular (in and out of the page) to the gate length ($L_g$) direction. In an embodiment, transistor 200 has a gate width (Gw) between 0.010 microns-100 microns. In an embodiment, drain field plate 220 extends the entire gate width (Gw) of transistor 200. In an embodiment, gate structure 208 has a "T" shape as illustrated in FIG. 2. Gate structure 208 may include an upper gate portion 213 and a lower gate portion 215. Upper gate portion 213 is distal from GaN layer 202 while lower gate portion 215 is nearer GaN layer 202. In an embodiment, lower gate portion 215 has a length ($L_g$) in the gate length direction which defines the gate length ($L_g$) of transistor 200. In an embodiment, upper gate portion 213 has length ($Lu_g$) in the gate length direction which is at least two times, and in other embodiments at least three times, greater than the gate length ($L_g$) of lower gate portion 215. In an embodiment, as shown in FIG. 2 upper gate portion 213 extends a distance ($d_{UG}$) above drain region 216 which is greater than the distance $d_{DFP}$ that drain field plate 220 extends above drain region 216. A recessed drain field plate may provide improved control of the drain field. In an embodiment, a recessed drain field plate may exert a depletion effect on the 2 DEG in the extended drain region. In an embodiment, upper gate portion 213 extends a distance ($d_{UG}$) above drain region 216 which is the same distance $d_{DFP}$ that drain field plate 220 extends above drain region 216. In an embodiment, gate dielectric 210 is disposed along the sidewalls and bottom of upper gate portion 213 and along the sidewalls and bottom of lower gate portion 215 as illustrated in FIG. 2.

In an embodiment, drain field plate 220 may be biased separately from a gate voltage (Vg) applied to gate structure 208. In an embodiment, drain field plate 220 may be biased to a potential different than Vss or ground. In an embodiment, drain field plate 220 may be biased differently than the voltage applied to source region 214. In an embodiment, drain field plate 220 may be biased differently than a voltage applied to drain region 216. In an embodiment, drain field plate 220 is not electrically connected to drain region 216.

In an embodiment, a pair of insulative spacers 270 are disposed along opposite sides of gate structure 208 as illustrated in FIG. 2. In an embodiment, insulative spacers 270 do not extend the entire height of gate structure 208. In an embodiment, insulative spacers 270 do not contact polarization layer 240 or GaN layer 202. In an embodiment, spacers 270 are formed beneath upper gate portion 213 and on sidewalls of lower gate portion 215 as illustrated in FIG. 2. In an embodiment, insulative spacers 270 are formed from an insulative material, such as but not limited to, silicon nitride and silicon oxynitride, which is different from the dielectric material of dielectric layer 260.

In an embodiment, a second dielectric layer 280 is disposed over dielectric layer 260. A plurality of conductive vias 282 may be disposed in dielectric 280 to enable independent electrical connections to and control of source region 214, drain region 216, drain field plate 220 and gate structure 208.

In an embodiment, a high-k dielectric 272, such as but not limited to hafnium oxide (e.g., HfO$_2$) and aluminum oxide (e.g., Al$_2$O$_3$) may be disposed and on the sidewalls and bottom surface of drain field plate 220 as illustrated in FIG. 2. In an embodiment, high-k dielectric 272 is the same high-k dielectric material as gate dielectric layer 210 of gate structure 208.

Figure 3:
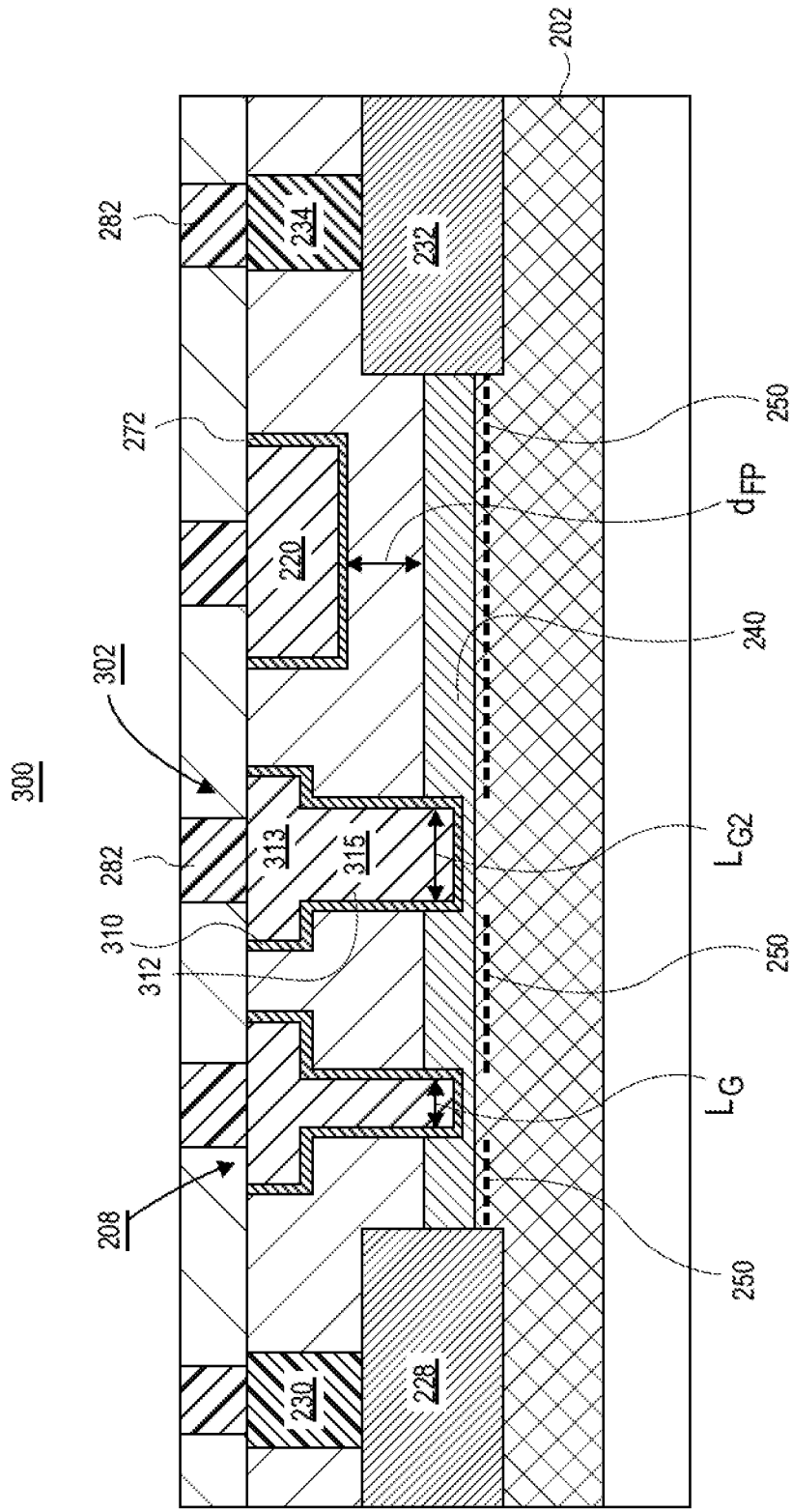
FIG. 3 illustrates a cross-sectional view of a GaN transistor having a drain field plate and having multiple gates, in accordance with embodiments of the present disclosure.

FIG. 3 illustrates a GaN transistor 300 having a drain field plate and multiple gates. Transistor 300 includes a second gate structure 302 above GaN layer 202 and between gate structure 208 and drain field plate 220 as illustrated in FIG. 3. Second gate structure 302 may be recessed into polarization layer 240 so that a 2 DEG layer of effect is not formed under second gate structure 302 as illustrated in FIG. 3. Gate structure 302 may include a gate dielectric 310, such as a high-k gate dielectric and a gate electrode 312 as described with respect to gate structure 208. In an embodiment, the second gate structure 302 has a larger gate length ($L_{G2}$) than the gate length ($L_g$) of gate structure 208. That is, in an embodiment, $L_{G2}$ is greater than $L_g$. In an embodiment, $L_{G2}$ is equal to $L_g$. In an embodiment, second gate structure 302 may have a "T" shape including an upper gate portion 313 and a lower gate portion 315 as illustrated in FIG. 3.

In an embodiment, two or more additional gate structures, 302 may be disposed over GaN layer 202 and between gate structure 208 and drain field plate 220. In an embodiment, gate structure 208 and each of the additional gate structures 302 may be bias separately. In an embodiment, the multiple gates act as an RF voltage divider allowing each gate to be biased with a lower DC voltage. A single gate NMOS transistor may require a large negative gate voltage (Vg) to keep the transistor in an "OFF" state. In an embodiment, transistor 300 may be used in a cascoded power amplifier circuit. Transistor 300 may improve gain by reducing source resistance of the second gate. Having two gate electrodes may protect the corresponding gate oxides from increased voltages.

To provide further context, GaN high voltage transistors in the market are not scaled. GaN transistors in the market today utilize long channel gates and thick p-GaN gate stack that may not be suitable for scaling the transistor to smaller dimensions to improve performance and low resistances. Moreover, coarse lithography techniques that are used may be limited as the industry remains working in 4 inch manufacturing lines that do not have access to the latest lithographic tools and techniques.

In accordance with one or more embodiments of the present disclosure, a heterostructure employing, p-InGaN and p-AlGaN layers in the gate of the GaN transistor, in addition to p-GaN, to enable scaling of the gate stack, thus enabling the further scaling of transistor channel length to improve performance: lower on-resistance and higher drive current. Other enabling features such as p-(III-N) field plate, multi-gate structures and hybrid trench plus implant isolation techniques are also disclosed herein to enable scaling of high voltage GaN transistor solutions. Such features can enable the ultimate scaling of high voltage GaN transistors to provide the highest performance in the smallest possible footprint.

In accordance with an embodiment of the present disclosure, a high voltage GaN transistor technology enables power delivery solutions that are more efficient than what is possible today. Servers and graphics products are powered by power delivery solutions with input voltages ranging between 48V to 72V. Discrete GaN transistors are used to step this high input voltage down to 5V on the board so that a second stage voltage conversion can be used in the subsequent power stages to convert the voltage to a desired supply voltage to integrated circuits, ranging from 3.3V to 0.5V, for example. Many stages of conversion are required using Si technology because at each stage, a different Si transistor technology is used. Dissimilar discrete technologies must thus be made to work together on the board or in bulky thick packages. GaN technology is unique in that it is the only technology that can be used across the entire power delivery value chain from 72V down to 0.6V. With a high voltage GaN transistor technology, power can ultimately be delivered at 48V to the socket of a microprocessor. Many benefits can be realized: the current level (I) on the board can be reduced, power dissipation (proportional to I$^2$) on the board can be significantly reduced, form factor can be significantly reduced (at least 2× shrink, up to 10× or more).

Figure 4:
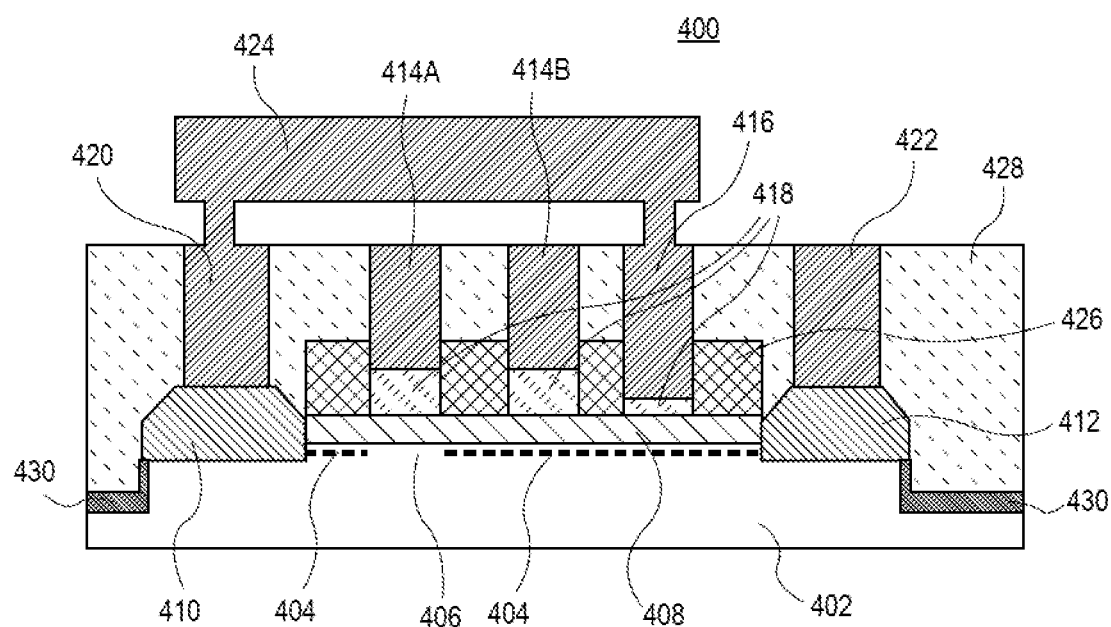
FIG. 4 illustrates a cross-sectional view of a high voltage scaled GaN device with multi-gate technology, in accordance with an embodiment of the present disclosure.

FIG. 4 illustrates a cross-sectional view of a high voltage scaled GaN device with multi-gate technology, in accordance with an embodiment of the present disclosure.

Referring to FIG. 4, a high voltage scaled GaN device 400 includes a GaN layer 402 including 2 DEG regions 404 and non 2 DEG regions 406. A p-GaN/p-InGaN/p-AlGaN field plating layer 408 is on the GaN layer 402 to provide a field-redistributing effect. N+ InGaN source or drain regions 410 and 412 are on the GaN layer 402. A p-GaN, p-InGaN, p-AlGaN regrown layer 418 is on the field plating layer 408. Gate electrodes 414A and 414B and a field plate electrode 416 are on the p-GaN, p-InGaN, p-AlGaN regrown layer 418. Source or drain contacts 420 and 422 are on the N+ InGaN source or drain regions 410 and 412. An interconnect line 424 couples the source or drain contact 420 and field plate electrode 416. An insulator layer 426, such as a silicon nitride (SiN) layer is included over the field plating layer 408. An inter-layer dielectric (ILD) layer 428 is over the structure. An H2-implant shallow-trench isolation layer 430 is on either side of the N+ InGaN source or drain regions 410 and 412.

Figure 5:
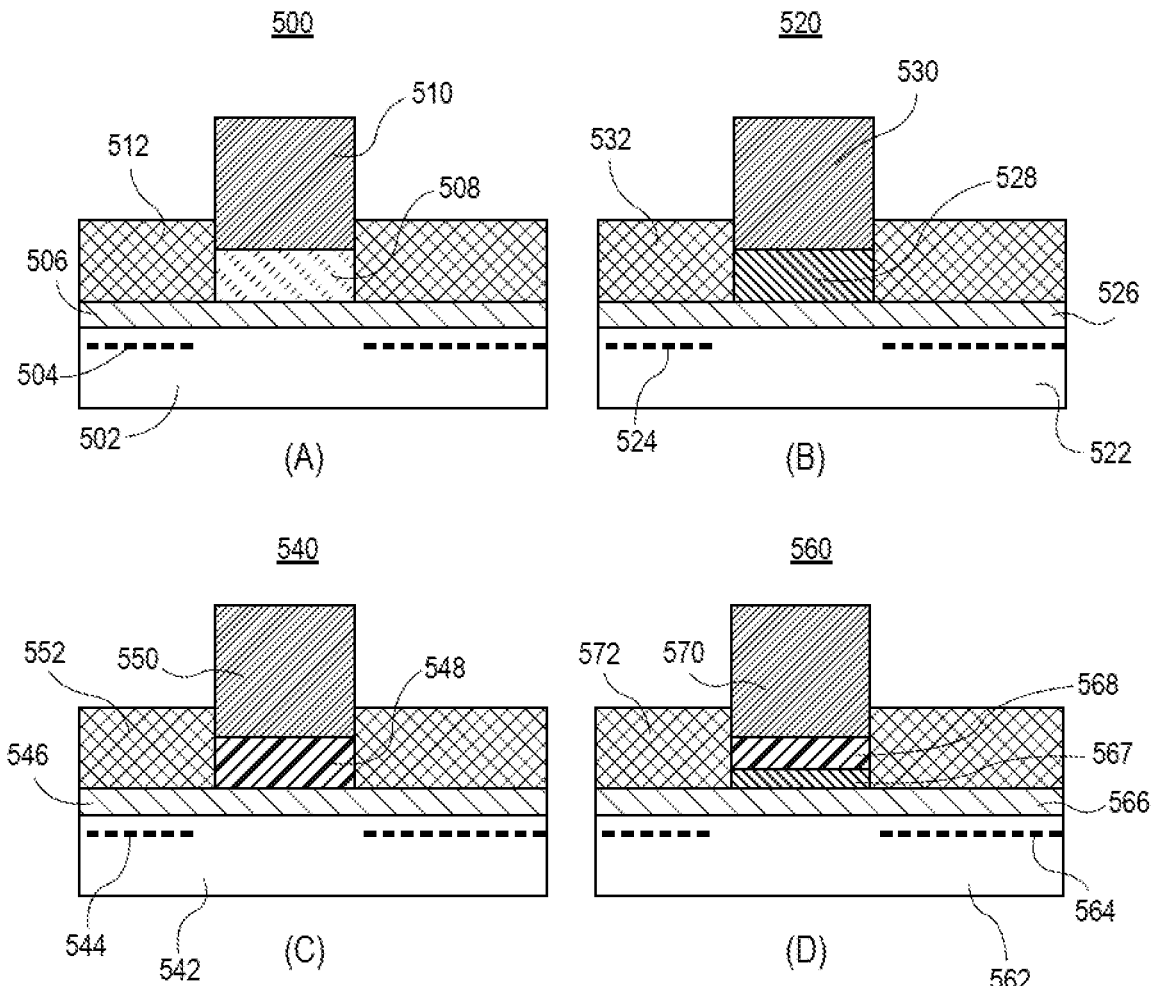
FIG. 5 illustrates cross-sectional views of various structural options for a high voltage scaled GaN device with multi-gate technology, in accordance with an embodiment of the present disclosure.

FIG. 5 illustrates cross-sectional views of various structural options for a high voltage scaled GaN device with multi-gate technology, in accordance with an embodiment of the present disclosure.

Referring to part (A) of FIG. 5, a gate structure 500 for a high voltage scaled GaN device includes a GaN layer 502 having a 2 DEG layer 504. An AlGaN layer 506 is on the GaN layer 502. A p-GaN layer 508 is on the AlGaN layer 506. A gate electrode 510 is on the p-GaN layer 508. The gate electrode 510 and the p-GaN layer 508 are within a dielectric layer 512, such as a silicon nitride (SiN) layer.

Referring to part (B) of FIG. 5, a gate structure 520 for a high voltage scaled GaN device includes a GaN layer 522 having a 2 DEG layer 524. An AlGaN layer 526 is on the GaN layer 522. A p-AlGaN layer 528 is on the AlGaN layer 526. A gate electrode 530 is on the p-AlGaN layer 528. The gate electrode 530 and the p-AlGaN layer 528 are within a dielectric layer 532, such as a silicon nitride (SiN) layer.

Referring to part (C) of FIG. 5, a gate structure 540 for a high voltage scaled GaN device includes a GaN layer 542 having a 2 DEG layer 544. An AlGaN layer 546 is on the GaN layer 542. A p-InGaN layer 548 is on the AlGaN layer 546. A gate electrode 550 is on the p-InGaN layer 548. The gate electrode 550 and the p-InGaN layer 548 are within a dielectric layer 552, such as a silicon nitride (SiN) layer.

Referring to part (D) of FIG. 5, a gate structure 560 for a high voltage scaled GaN device includes a GaN layer 562 having a 2 DEG layer 564. An AlGaN layer 566 is on the GaN layer 562. A p-AlGaN layer 567 is on the AlGaN layer 566. A p-InGaN layer 568 is on the p-AlGaN layer 567. A gate electrode 570 is on the p-InGaN layer 568. The gate electrode 570, the p-InGaN layer 568 and the p-AlGaN layer 567 are within a dielectric layer 572, such as a silicon nitride (SiN) layer.

In an embodiment, using a p-InGaN layer can translate to higher active p-dopants being achieved. With higher active p-dopants compared to p-GaN, thinner p-InGaN can be used to deplete 2 DEG in channel for e-mode. Thinner EOT enables shorter channel length, hence higher performance (lower Rory and higher drive current). In an embodiment, using a p-AlGaN layer can translate to higher barrier to electrons, although lower p-dopants. With higher energy barrier to electrons, p-AlGaN can be used to reduce the thickness of the p-doped barrier to enable shorter channel length as well as to increase the P-N junction turn-on voltage and reduce gate leakage. Heterostructures, e.g. p-InGaN/p-AlGaN/AlGaN/GaN channel can be used to achieve combinations of the characteristics described above.

Figure 6:
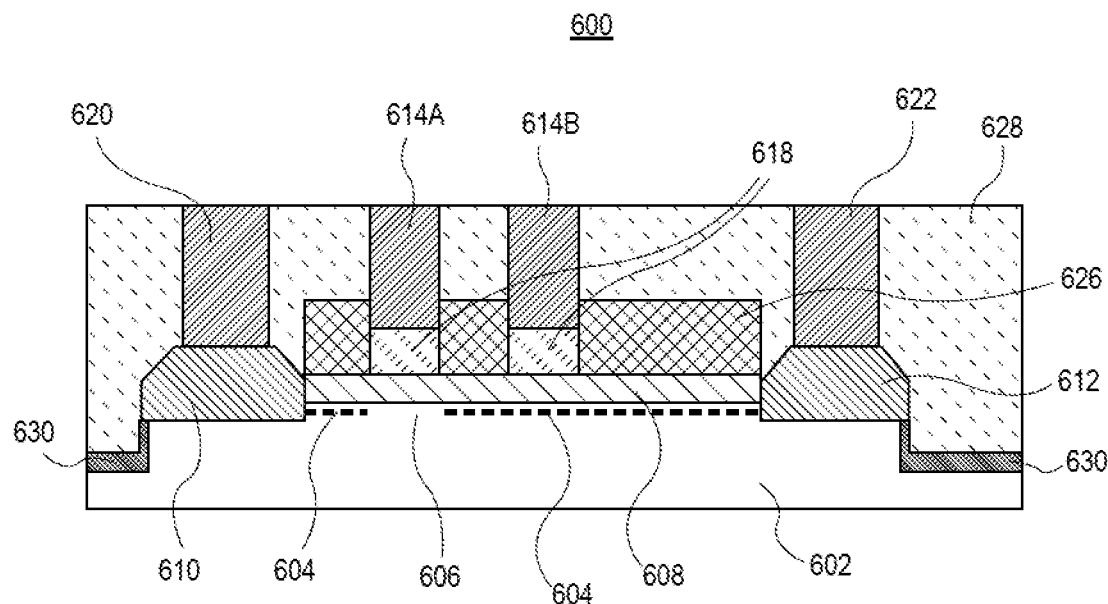
FIG. 6 illustrates cross-sectional views of various structural options for a high voltage scaled GaN device with multi-gate technology, in accordance with another embodiment of the present disclosure.

FIG. 6 illustrates cross-sectional views of various structural options for a high voltage scaled GaN device with multi-gate technology, in accordance with another embodiment of the present disclosure.

Referring to FIG. 6, a high voltage scaled GaN device 600 includes a GaN layer 602 including 2 DEG regions 604 and non 2 DEG regions 606. N+ InGaN source or drain regions 610 and 612 are on the GaN layer 602. A p-GaN, p-InGaN, p-AlGaN regrown layer 618 is on the polarization layer 608 to provide a field-redistribution effect. Gate electrodes 614A and 614B are on the p-GaN, p-InGaN, p-AlGaN regrown layer 618. Source or drain contacts 620 and 622 are on the N+ InGaN source or drain regions 610 and 612. An insulator layer 626, such as a silicon nitride (SiN) layer is included over the polarization layer 608. An inter-layer dielectric (ILD) layer 628 is over the structure. An H2-implant shallow-trench isolation layer 630 is on either side of the N+ InGaN source or drain regions 610 and 612.

In an embodiment, multi-gates can extend the voltage handling capability and incur minimal increase in on-resistance and transistor drive current. Multi-gates also improve drain induced barrier leakage (DIBL), and reduce off-state leakage.

Figure 7:
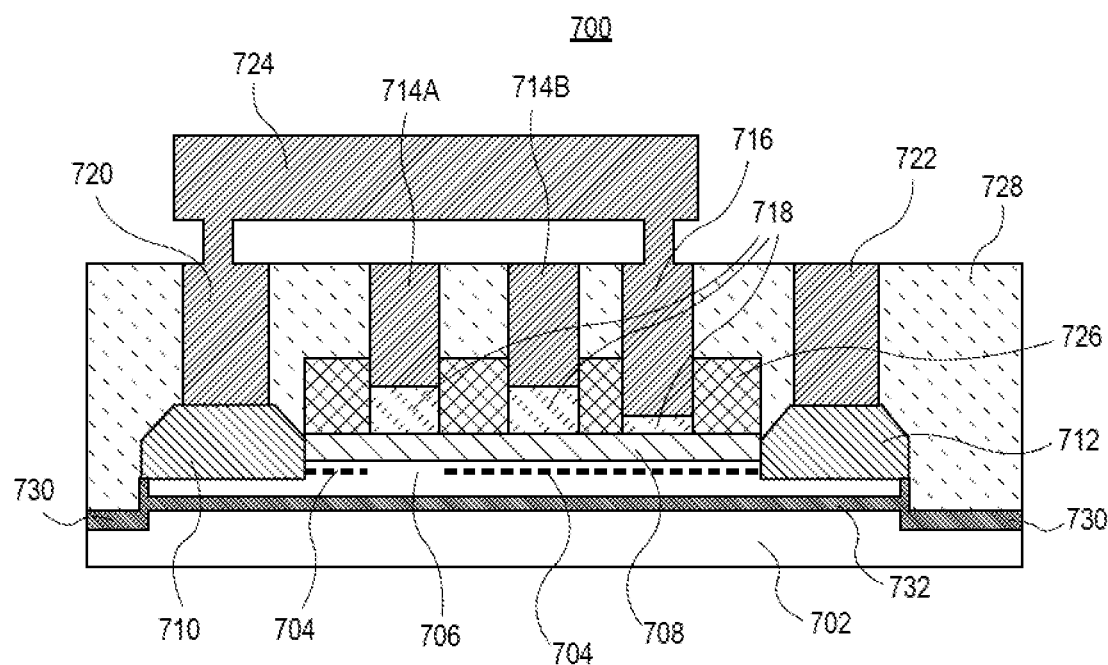
FIG. 7 illustrates cross-sectional views of various structural options for a high voltage scaled GaN device with multi-gate technology, in accordance with another embodiment of the present disclosure.

FIG. 7 illustrates cross-sectional views of various structural options for a high voltage scaled GaN device with multi-gate technology, in accordance with another embodiment of the present disclosure.

Referring to FIG. 7, a high voltage scaled GaN device 700 includes a GaN layer 702 including 2 DEG regions 704 and non 2 DEG regions 706. N+ InGaN source or drain regions 710 and 712 are on the GaN layer 702. A p-GaN, p-InGaN, p-AlGaN regrown layer 718 is on the polarization layer 708 to provide a field-redistribution effect. Gate electrodes 714A and 714B and a field plate electrode 716 are on the p-GaN, p-InGaN, p-AlGaN regrown layer 718. Source or drain contacts 720 and 722 are on the N+InGaN source or drain regions 710 and 712. An interconnect line 724 couples the source or drain contact 720 and field plate electrode 716. An insulator layer 726, such as a silicon nitride (SiN) layer is included over the field plating layer 708. An inter-layer dielectric (ILD) layer 728 is over the structure. An H2-implant shallow-trench isolation layer 730 is on either side of the N+ InGaN source or drain regions 710 and 712. An H2-implant region 732 is under a channel region of the device 700.

In an embodiment, aside from providing a field-plate (FP) to redistribute the high lateral electric field on the drain side of the transistor, a p-GaN/p-InGaN/p-AlGaN field plate can inject compensating holes into the channel in the drain region to neutralized electrons that are trapped in the high field region on the drain side. High energy hydrogen atoms can be implanted in the shallow-trench isolation region to further isolate each GaN transistor active region from the rest of the wafer. Further, a hydrogen implant plane can be achieved underneath the GaN 2 DEG for further isolation of GaN transistor active region from the GaN buffer and substrate. In one embodiment, voltage converter circuit topologies enabled by these devices include LLC resonant converter, switched capacitor converters, buck converters, and others.

In a second aspect, stacked GaN NMOS/Si PMOS FinFETs for GaN CMOS applications are described.

To provide context, CMOS functionality can be provided to a GaN system for RF and power applications. However, currently, no solution exists to integrate both NMOS and PMOS on GaN.

In accordance with one or more embodiments of the present disclosure, a layer transfer technique is utilized to create stacked GaN plus Si finfet transistors. Embodiments can be implemented to provide CMOS functionality for GaN RF applications utilizing 300 mm fabrication techniques. In one embodiment, a bonding oxide is included as part of the final device structure, e.g., a device can include a layer of single crystalline silicon on top of an amorphous bonding oxide on top of GaN with a significantly different lattice constant. Embodiments can be implemented to create a stacked GaN NMOS and Si PMOS device with shared or split gates for GaN CMOS using a layer transfer and selective removal of bonding oxide in replacement gate loop.

Figure 8A:
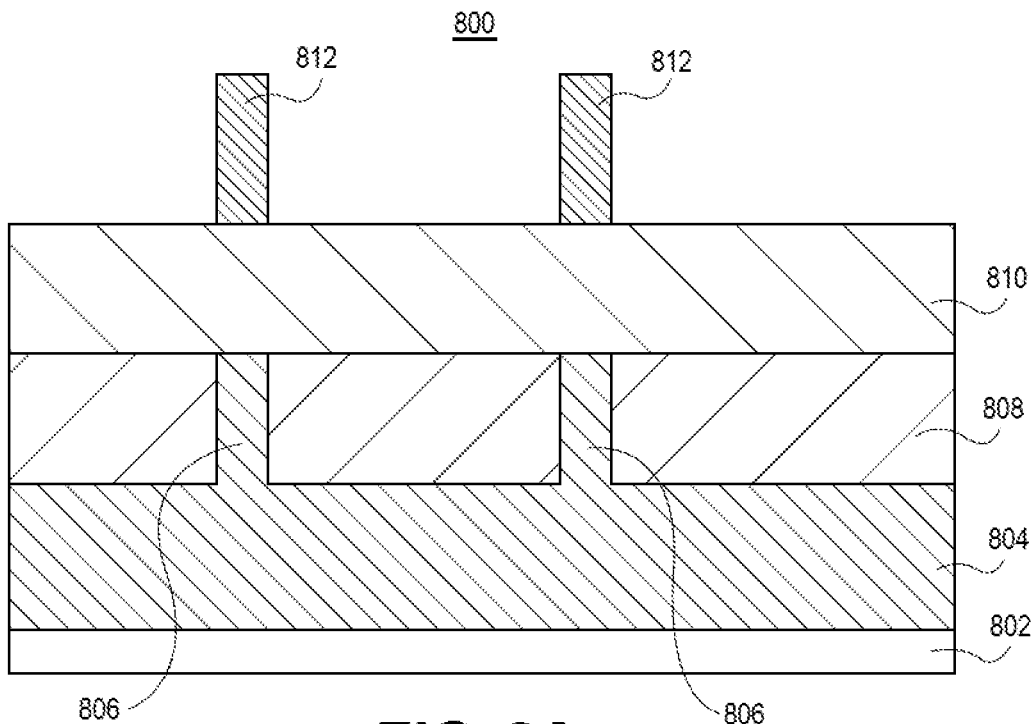
FIGS. 8A-8B illustrate cross-sectional views representing various operations in a method of fabricating a GaN/Si device foundation structure, in accordance with an embodiment of the present disclosure.
Figure 8B:
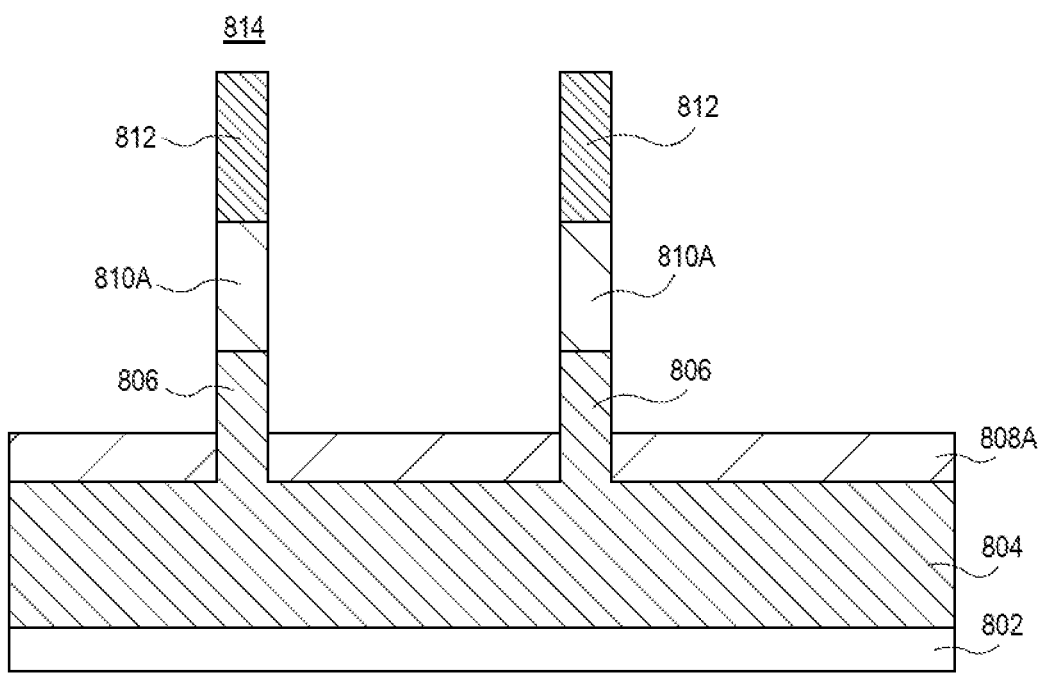

As an exemplary processing scheme for, FIGS. 8A-8B illustrate cross-sectional views representing various operations in a method of fabricating a GaN/Si device foundation structure, in accordance with an embodiment of the present disclosure.

Referring to FIG. 8A, a starting structure 800 includes a silicon substrate 802 having a GaN layer 804 epitaxially grown thereon. GaN fins 806 are etched into the GaN layer 804. An isolation layer 808, such as a high density silicon oxide layer, is laterally adjacent to the GaN fins 806. In one embodiment, the isolation layer 808 has an uppermost surface co-planar with an uppermost surface of the GaN fins 806, as is depicted. A bonding layer 810, such as a low density silicon oxide layer, is on the isolation layer 808 and the GaN fins 806. Silicon fins 812 are on the bonding layer 810. In one embodiment, the silicon fins 812 are transferred to the isolation layer 808 by the bonding layer 810. In one embodiment, the silicon fins are in alignment with the GaN fins 806, as is depicted.

Referring to FIG. 8B, the starting structure 800 is exposed to an etch process to remove exposed portions of the bonding layer 810 and to recess the isolation layer 808. The etching leaves bonding layer portion 810A and recessed isolation layer 808A. The bonding layer portion 810A is vertically between corresponding pairs of the silicon fins 812 and the GaN fins 806.

The structure of FIG. 8B can be used to fabricate a device. As an exemplary device, FIGS. 9A and 9B illustrate cross-sectional views along a fin cut and a gate cut respectfully, in accordance with an embodiment of the present disclosure.

Figure 9A:
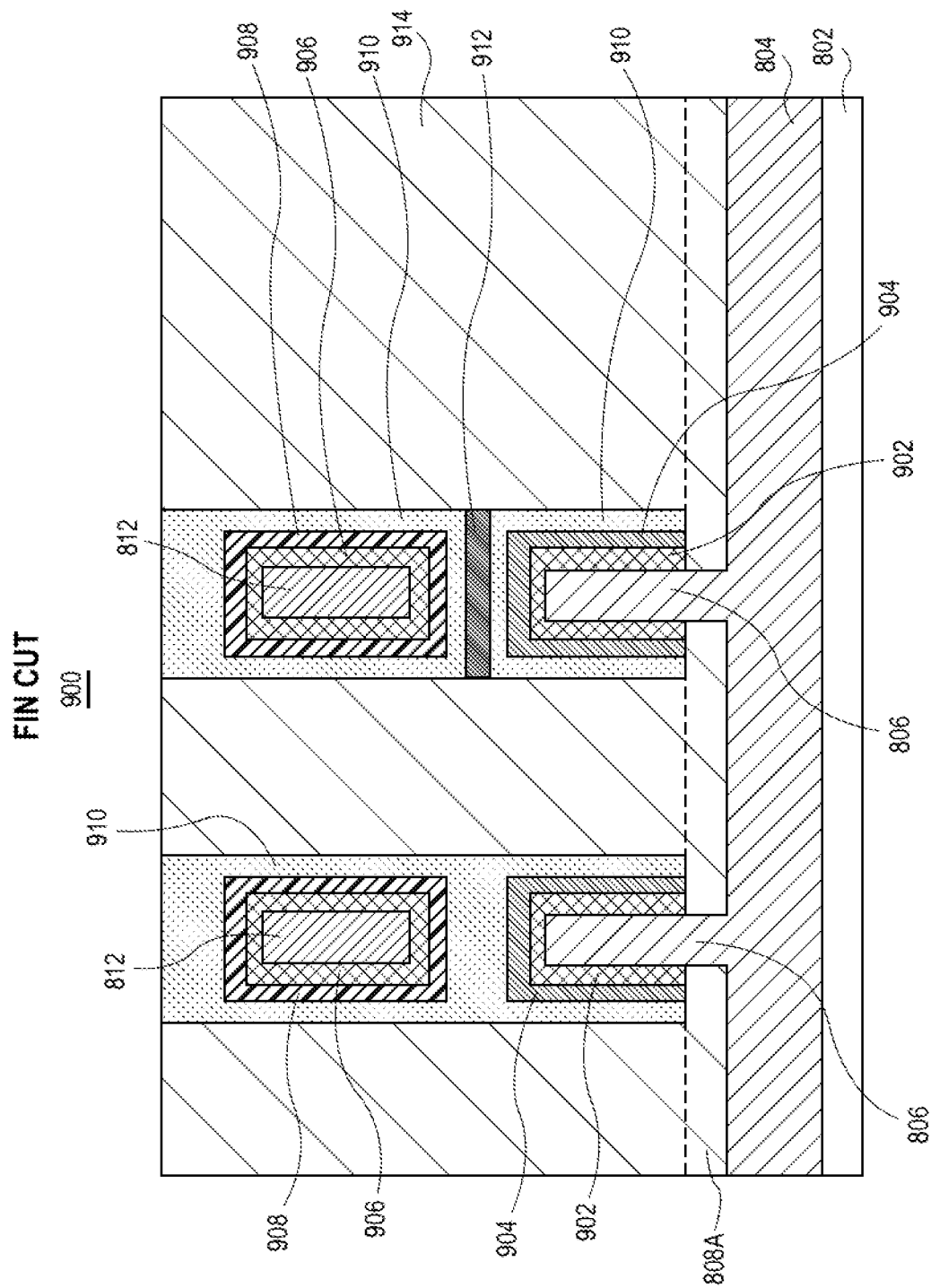
FIGS. 9A and 9B illustrate cross-sectional views along a fin cut and a gate cut respectfully, in accordance with an embodiment of the present disclosure.

Referring to FIG. 9A, as seen from a fin cut perspective, an integrated circuit structure 900 includes pairs of GaN fins 806 and corresponding silicon fins 812 vertically over the GaN fins 806. A gate dielectric 902, such as a high-k dielectric layer, is over a top and along sidewalls of each of the GaN fins 806. A gate electrode layer 904, such as an N-type workfunction layer, is over the gate dielectric 902. In one embodiment, in the channel region, the bonding layer portion 810A is removed to leave silicon fins 812 exposed at the bottom, effectively forming silicon nanowires, as is depicted. A gate dielectric 906, such as a high-k dielectric layer, is over a top and along sidewalls and along a bottom of each of the silicon fins 812, as is depicted. A gate electrode layer 908, such as a P-type workfunction layer, is over the gate dielectric 906. A gate fill layer 910 is over the gate electrode layer 904 and over the gate electrode layer 908. In one embodiment, the gate fill layer 910 is continuous between a GaN fin 806/silicon fin 812 pair, such as depicted on the left-hand side of FIG. 9A. In one embodiment, the gate fill layer 910 is separated by an isolation layer 912 between a GaN fin 806/silicon fin 812 pair, such as depicted on the right-hand side of FIG. 9A. An inter-layer dielectric layer 914 is over the structure.

Figure 9B:
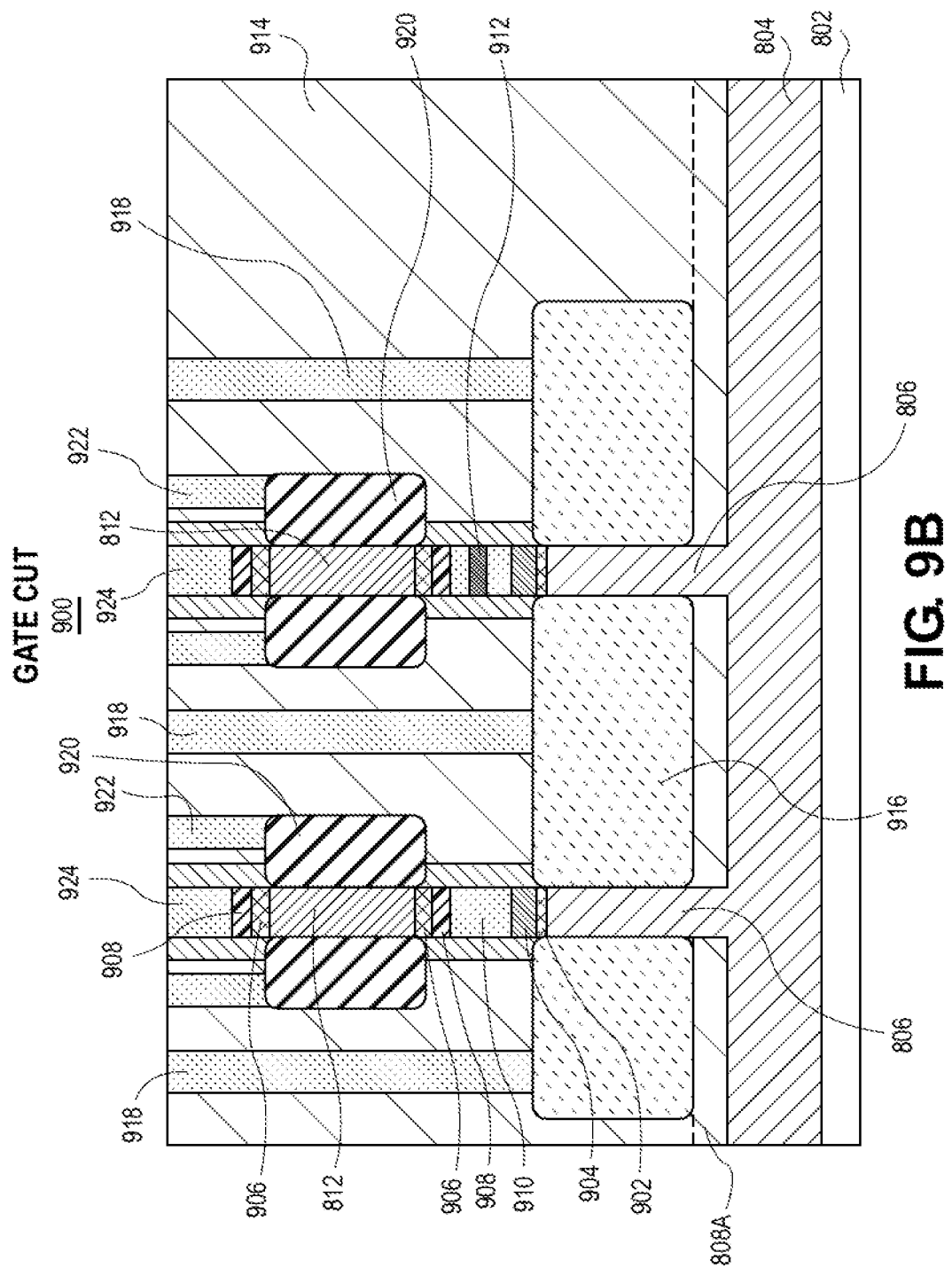

Referring to FIG. 9B, as seen from a gate cut perspective, the integrated circuit structure 900 includes epitaxial source or drain structures 916 laterally adjacent to the GaN fins 806. Source or drain contacts 918 are coupled to the epitaxial source or drain structures 916. Epitaxial source or drain structures 920 are laterally adjacent to the Si fins 812. Source or drain contacts 922 are coupled to the epitaxial source or drain structures 920. The upper portions 924 of gate fill layer 910 can effectively act as gate contacts.

With reference again to FIGS. 9A and 9B, in accordance with an embodiment of the present disclosure, an integrated circuit structure 900 includes a fin 806, the fin 806 including gallium and nitrogen. The integrated circuit structure 900 also includes a nanowire 812 including silicon. The nanowire 812 is vertically over the fin 806. A gate structure 902/904/906/908/910 is around the nanowire 812 and over the fin 806. The gate structure 902/904/906/908/910 includes an N-type gate electrode layer 904 over the fin 806, and the gate structure 902/904/906/908/910 includes a P-type gate electrode layer 908 around the nanowire 812.

In one embodiment, the gate structure 902/904/906/908/910 includes a conductive gate fill material 910 continuous between the N-type gate electrode layer 904 and the P-type gate electrode layer 908 (e.g., as shown on the left-hand side of FIG. 9A). In one embodiment, the gate structure 902/904/906/908/910 includes a conductive gate fill 910 material non-continuous between the N-type gate electrode 904 layer and the P-type gate electrode layer 908 (e.g., as shown on the right-hand side of FIG. 9A). In one embodiment, the integrated circuit structure 900 further includes an isolation layer 912 between the nanowire 812 and the fin 806 (e.g., as shown on the right-hand side of FIG. 9A). In one embodiment, there is no isolation layer between the nanowire 812 and the fin 806 (e.g., as shown on the left-hand side of FIG. 9A).

With reference to the GaN portions of the devices of FIGS. 9A and 9B, embodiments of the disclosure can relate to gallium nitride (GaN) transistors having multiple threshold voltages and their methods of fabrication. A GaN transistor, in accordance with embodiments, includes a gallium nitride layer above a substrate, such as a silicon monocrystalline substrate. A gate stack is disposed above the GaN layer. A source region and a drain region are disposed on opposite sides of the gate stack. A polarization layer including a group III-N semiconductor is disposed on the GaN layer and beneath the gate stack. The polarization layer may have a first thickness, including a zero thickness, beneath a first gate portion of the gate stack and a second thickness greater than the first thickness beneath a second gate portion of the gate stack. The thickness of the polarization layer or lack of a polarization layer beneath the gate stack affects the threshold voltage of the overlying portion of the gate stack. By providing different thicknesses of the polarization layer beneath different portions of the gate stack, a transistor may be engineered to have two or more different threshold voltages. In an embodiment, a transistor has a threshold voltage in the range of 1V to −6V. A GaN transistor having multiple threshold voltages may be fabricated as a planar transistor or a nonplanar transistor. In embodiments of the present disclosure, a GaN transistor having two or more threshold voltages may be used to create a hybrid class A+AB power amplifier with improved linearity.

Figure 10:
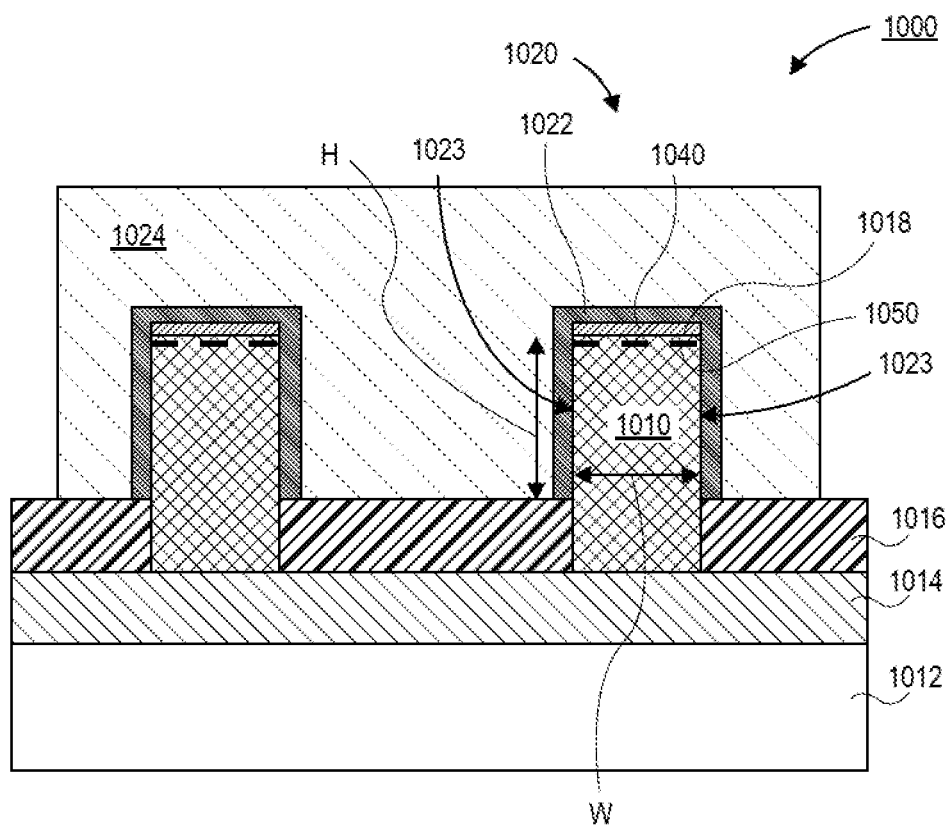
FIG. 10 illustrates a cross-sectional view of a nonplanar or tri-gate GaN transistor having multiple threshold voltages in accordance with embodiments of the present disclosure.

FIG. 10 illustrates a cross-sectional view of a nonplanar or tri-gate GaN transistor 1000 having multiple threshold voltages in accordance with embodiments of the present disclosure. Transistor 1000 includes a GaN fin 1010 disposed above a substrate, such as but not limited to a monocrystalline silicon substrate, silicon carbide substrate, or a sapphire substrate. A buffer layer 1014 may be disposed between GaN fin 1010 and substrate 1012. Fin 1010 has a pair of laterally opposite sidewalls 1023 and a top surface 1018 between the laterally opposite sidewalls 1023. In an embodiment, top surface 1018 of GaN fin 1010 is a (1000) plane or a c-plane of GaN. An oxide layer, such as an oxide of a shallow trench isolation (STI) may be disposed above substrate 1012 and may surround a bottom portion of fin 1010, so that an upper portion of fin 1010 extends above oxide 1016 as illustrated in FIG. 10.

A polarization layer 1040 is disposed on the top surface 1018 of fin 1010. In an embodiment, polarization layer 1040 is a group III-N semiconductor material, such as but not limited to AlGaInN, AlGaN, and AlInN. In an embodiment polarization layer 1040 is not formed on sidewall 1023 of fin 1010. A gate stack 1020 is disposed over polarization layer 1040 on the top surface 1018 of fin 1010 and is disposed over the sidewalls 1023 of fin 1010 as illustrated in FIG. 10. Gate stack 1020 may include a gate dielectric 1022, such as but not limited to hafnium oxide (e.g. $HfO_2$) or aluminum oxide (e.g. $Al_2O_3$) and a gate electrode 1024 such as a metal gate electrode. Gate dielectric 1022 may be disposed between gate electrode 1024 and sidewalls 1023 of gate electrode 1024 and between gate electrode 1024 and polarization layer 1040 on the top surface of GaN fin 1010. A source region and a drain region (not shown) may be disposed on opposite sides (into and out of the page) of the gate stack 1020 as is well-known in the art. The source and drain regions each may include a group III-N semiconductor contact, such as but not limited to InGaN.

In an embodiment, polarization layer 1040 is of a sufficient thickness to create a 2 DEG layer in the top surface of fin 1010 as illustrated in FIG. 10. In an alternative embodiment, polarization layer 1040 has a thickness which is insufficient to create a 2 DEG layer in the top surface of fin 1010, however, is of a sufficient thickness in order to provide a different threshold voltage for the portion of the gate stack 1020 over the top surface 1018 of fin 1010 relative to the threshold voltage of the gate stack 1020 adjacent to the sidewalls 1023 of fin 1010. In either case, transistor 1000 has two different threshold voltages, a first threshold voltage (VT1) associated with a portion of the gate stack 1020 over/adjacent to the sidewalls 1023 of fin 1010 and second threshold voltage (VT2), such as a lower threshold voltage, associated with the portion of the gate stack 1020 over polarization layer 1040 and top surface 1018 of fin 1010. The width (W) of and the height (H) of the portion of fin 1010 may be chosen to create the desired amount of current provided by the top surface 1018 of fin 1010 relative to the sidewalls 1023 of fin 1010. In an embodiment, an additional fin or fins including a top polarization layer may be included to increase the current carrying capability of transistor 1000, an example of which is shown in FIG. 10.

As described throughout the present application, a substrate may be composed of a semiconductor material that can withstand a manufacturing process and in which charge can migrate. In an embodiment, a substrate is described herein is a bulk substrate composed of a crystalline silicon, silicon/germanium or germanium layer doped with a charge carrier, such as but not limited to phosphorus, arsenic, boron or a combination thereof, to form an active region. In one embodiment, the concentration of silicon atoms in such a bulk substrate is greater than 97%. In another embodiment, a bulk substrate is composed of an epitaxial layer grown atop a distinct crystalline substrate, e.g. a silicon epitaxial layer grown atop a boron-doped bulk silicon mono-crystalline substrate. A bulk substrate may alternatively be composed of a group III-V material. In an embodiment, a bulk substrate is composed of a III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, a bulk substrate is composed of a III-V material and the charge-carrier dopant impurity atoms are ones such as, but not limited to, carbon, silicon, germanium, oxygen, sulfur, selenium or tellurium.

As described throughout the present application, isolation regions such as shallow trench isolation regions or sub-fin isolation regions may be composed of a material suitable to ultimately electrically isolate, or contribute to the isolation of, portions of a permanent gate structure from an underlying bulk substrate or to isolate active regions formed within an underlying bulk substrate, such as isolating fin active regions. For example, in one embodiment, an isolation region is composed of one or more layers of a dielectric material such as, but not limited to, silicon dioxide, silicon oxy-nitride, silicon nitride, carbon-doped silicon nitride, or a combination thereof.

As described throughout the present application, gate lines or gate structures may be composed of a gate electrode stack which includes a gate dielectric layer and a gate electrode layer. In an embodiment, the gate electrode of the gate electrode stack is composed of a metal gate and the gate dielectric layer is composed of a high-K material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of a semiconductor substrate. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride. In some implementations, a portion of the gate dielectric is a "U"-shaped structure that includes a bottom portion substantially parallel to the surface of the substrate and two sidewall portions that are substantially perpendicular to the top surface of the substrate.

In one embodiment, a gate electrode is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer. The gate electrode layer may consist of a P-type workfunction metal or an N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a conductive fill layer. For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV. In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

As described throughout the present application, spacers associated with gate lines or electrode stacks may be composed of a material suitable to ultimately electrically isolate, or contribute to the isolation of, a permanent gate structure from adjacent conductive contacts, such as self-aligned contacts. For example, in one embodiment, the spacers are composed of a dielectric material such as, but not limited to, silicon dioxide, silicon oxy-nitride, silicon nitride, or carbon-doped silicon nitride.

In an embodiment, approaches described herein may involve formation of a contact pattern which is very well aligned to an existing gate pattern while eliminating the use of a lithographic operation with exceedingly tight registration budget. In one such embodiment, this approach enables the use of intrinsically highly selective wet etching (e.g., versus dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in other approaches. In an embodiment, a trench contact grid is not separately patterned, but is rather formed between poly (gate) lines. For example, in one such embodiment, a trench contact grid is formed subsequent to gate grating patterning but prior to gate grating cuts.

Furthermore, a gate stack structure may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous $NH_4OH$ or tetramethylammonium hydroxide. In one embodiment, dummy gates are composed of silicon nitride and are removed with a wet etch including aqueous phosphoric acid.

In an embodiment, one or more approaches described herein contemplate essentially a dummy and replacement gate process in combination with a dummy and replacement contact process to arrive at structure. In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed, is performed at a temperature greater than approximately 600 degrees Celsius. The anneal is performed prior to formation of the permanent contacts.

In some embodiments, the arrangement of a semiconductor structure or device places a gate contact over portions of a gate line or gate stack over isolation regions. However, such an arrangement may be viewed as inefficient use of layout space. In another embodiment, a semiconductor device has contact structures that contact portions of a gate electrode formed over an active region. In general, prior to (e.g., in addition to) forming a gate contact structure (such as a via) over an active portion of a gate and in a same layer as a trench contact via, one or more embodiments of the present disclosure include first using a gate aligned trench contact process. Such a process may be implemented to form trench contact structures for semiconductor structure fabrication, e.g., for integrated circuit fabrication. In an embodiment, a trench contact pattern is formed as aligned to an existing gate pattern. By contrast, other approaches typically involve an additional lithography process with tight registration of a lithographic contact pattern to an existing gate pattern in combination with selective contact etches. For example, another process may include patterning of a poly (gate) grid with separate patterning of contact features.

It is to be appreciated that not all aspects of the processes described above need be practiced to fall within the spirit and scope of embodiments of the present disclosure. For example, in one embodiment, dummy gates need not ever be formed prior to fabricating gate contacts over active portions of the gate stacks. The gate stacks described above may actually be permanent gate stacks as initially formed. Also, the processes described herein may be used to fabricate one or a plurality of semiconductor devices. The semiconductor devices may be transistors or like devices. For example, in an embodiment, the semiconductor devices are a metal-oxide semiconductor (MOS) transistors for logic or memory, or are bipolar transistors. Also, in an embodiment, the semiconductor devices have a three-dimensional architecture, such as a trigate device, an independently accessed double gate device, a FIN-FET, a nanowire, or a nanoribbon.

Additional or intermediate operations for FEOL layer or structure fabrication may include standard microelectronic fabrication processes such as lithography, etch, thin films deposition, planarization (such as chemical mechanical polishing (CMP)), diffusion, metrology, the use of sacrificial layers, the use of etch stop layers, the use of planarization stop layers, or any other associated action with microelectronic component fabrication. Also, it is to be appreciated that the process operations described for the preceding process flows may be practiced in alternative sequences, not every operation need be performed or additional process operations may be performed, or both.

It is to be appreciated that the layers and materials described above in association with back end of line (BEOL) structures and processing may be formed on or above an underlying semiconductor substrate or structure, such as underlying device layer(s) of an integrated circuit. In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials, such as substrates including germanium, carbon, or group III-V materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. Furthermore, the structures depicted may be fabricated on underlying lower level interconnect layers.

Although the preceding methods of fabricating a metallization layer, or portions of a metallization layer, of a BEOL metallization layer are described in detail with respect to select operations, it is to be appreciated that additional or intermediate operations for fabrication may include standard microelectronic fabrication processes such as lithography, etch, thin films deposition, planarization (such as chemical mechanical polishing (CMP)), diffusion, metrology, the use of sacrificial layers, the use of etch stop layers, the use of planarization stop layers, or any other associated action with microelectronic component fabrication. Also, it is to be appreciated that the process operations described for the preceding process flows may be practiced in alternative sequences, not every operation need be performed or additional process operations may be performed or both.

In an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by techniques, such as, for example, chemical vapor deposition (CVD), physical vapor deposition (PVD), or by other deposition methods.

In an embodiment, as is also used throughout the present description, metal lines or interconnect line material (and via material) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers (e.g., layers including one or more of Ta, TaN, Ti or TiN), stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a conductive material such as, but not limited to, Cu, Al, Ti, Zr, Hf, V, Ru, Co, Ni, Pd, Pt, W, Ag, Au or alloys thereof. The interconnect lines are also sometimes referred to in the art as traces, wires, lines, metal, or simply interconnect.

In an embodiment, as is also used throughout the present description, hardmask materials are composed of dielectric materials different from the interlayer dielectric material. In one embodiment, different hardmask materials may be used in different regions so as to provide different growth or etch selectivity to each other and to the underlying dielectric and metal layers. In some embodiments, a hardmask layer includes a layer of a nitride of silicon (e.g., silicon nitride) or a layer of an oxide of silicon, or both, or a combination thereof. Other suitable materials may include carbon-based materials. In another embodiment, a hardmask material includes a metal species. For example, a hardmask or other overlying material may include a layer of a nitride of titanium or another metal (e.g., titanium nitride). Potentially lesser amounts of other materials, such as oxygen, may be included in one or more of these layers. Alternatively, other hardmask layers known in the arts may be used depending upon the particular implementation. The hardmask layers maybe formed by CVD, PVD, or by other deposition methods.

Embodiments disclosed herein may be used to manufacture a wide variety of different types of integrated circuits or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 11:
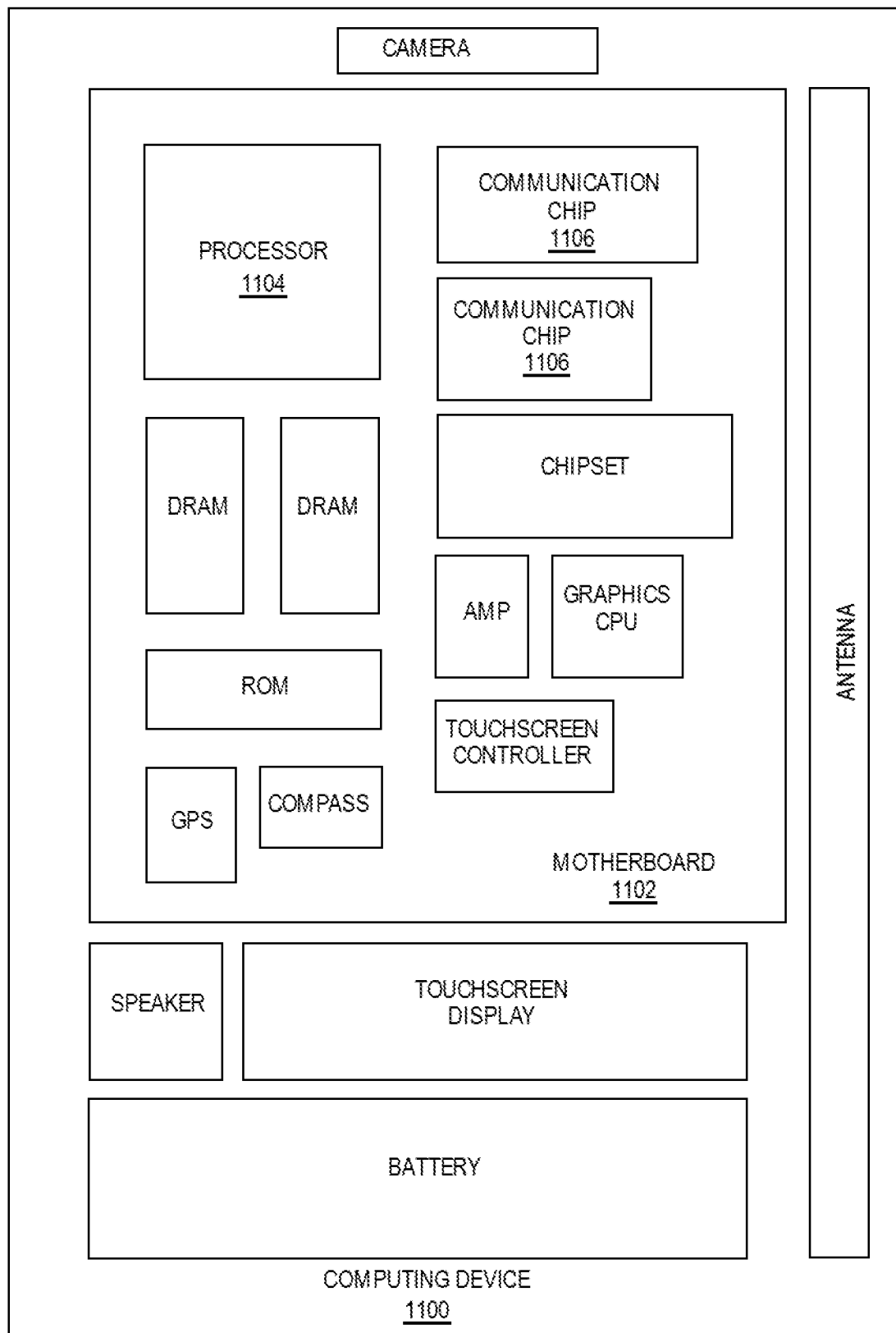
FIG. 11 illustrates a computing device in accordance with one implementation of the disclosure.

FIG. 11 illustrates a computing device 1100 in accordance with one implementation of the disclosure. The computing device 1100 houses a board 1102. The board 1102 may include a number of components, including but not limited to a processor 1104 and at least one communication chip 1106. The processor 1104 is physically and electrically coupled to the board 1102. In some implementations the at least one communication chip 1106 is also physically and electrically coupled to the board 1102. In further implementations, the communication chip 1106 is part of the processor 1104.

Depending on its applications, computing device 1100 may include other components that may or may not be physically and electrically coupled to the board 1102. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1106 enables wireless communications for the transfer of data to and from the computing device 1100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1106 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1100 may include a plurality of communication chips 1106. For instance, a first communication chip 1106 may be dedicated to shorter range wireless communications such as Wi-Fi and Bluetooth and a second communication chip 1106 may be dedicated to longer range wireless communications such as GPS, EDGE, GPRS, CDMA, WiMAX, LTE, Ev-DO, and others.

The processor 1104 of the computing device 1100 includes an integrated circuit die packaged within the processor 1104. In some implementations of embodiments of the disclosure, the integrated circuit die of the processor includes one or more structures, such as integrated circuit structures built in accordance with implementations of the disclosure. The term "processor" may refer to any device or portion of a device that processes electronic data from registers or memory to transform that electronic data, or both, into other electronic data that may be stored in registers or memory, or both.

The communication chip 1106 also includes an integrated circuit die packaged within the communication chip 1106. In accordance with another implementation of the disclosure, the integrated circuit die of the communication chip is built in accordance with implementations of the disclosure.

In further implementations, another component housed within the computing device 1100 may contain an integrated circuit die built in accordance with implementations of embodiments of the disclosure.

In various embodiments, the computing device 1100 may be a laptop, a netbook, a notebook, an ultrabook, a smartphone, a tablet, a personal digital assistant (PDA), an ultramobile PC, a mobile phone, a desktop computer, a server, a printer, a scanner, a monitor, a set-top box, an entertainment control unit, a digital camera, a portable music player, or a digital video recorder. In further implementations, the computing device 1100 may be any other electronic device that processes data.

Figure 12:
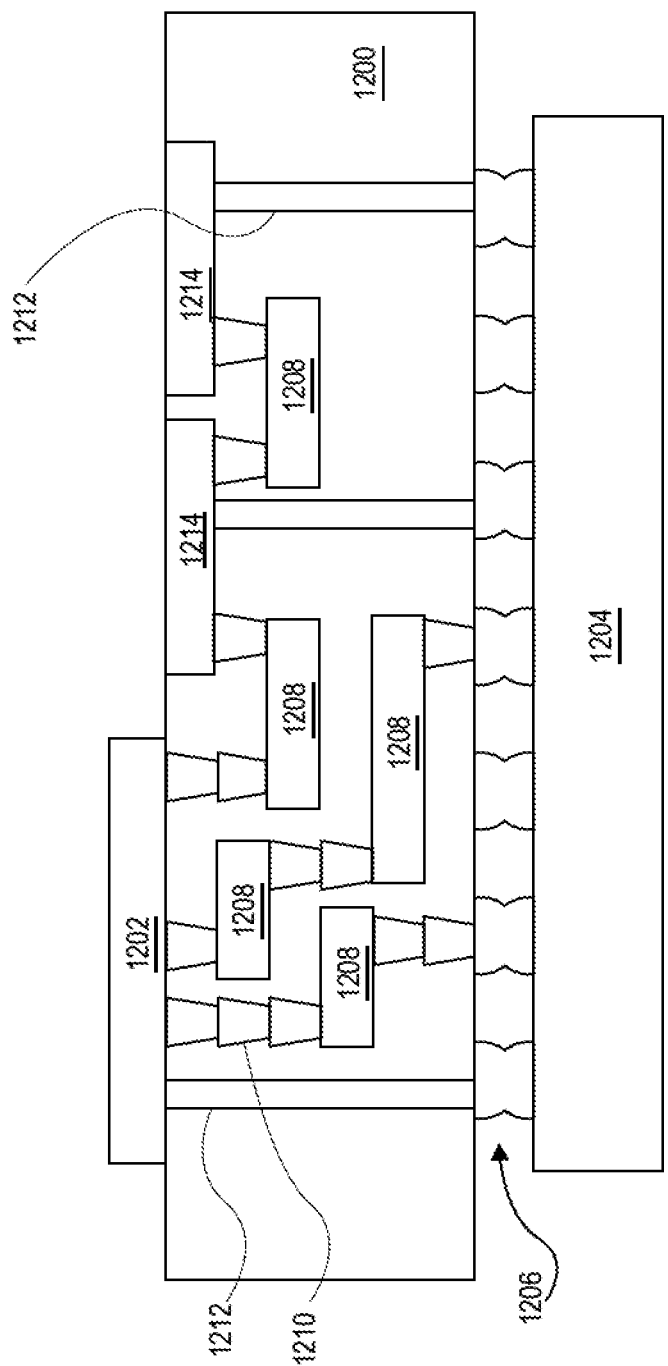
FIG. 12 illustrates an interposer that includes one or more embodiments of the disclosure.

FIG. 12 illustrates an interposer 1200 that includes one or more embodiments of the disclosure. The interposer 1200 is an intervening substrate used to bridge a first substrate 1202 to a second substrate 1204. The first substrate 1202 may be, for instance, an integrated circuit die. The second substrate 1204 may be, for instance, a memory module, a computer motherboard, or another integrated circuit die. Generally, the purpose of an interposer 1200 is to spread a connection to a wider pitch or to reroute a connection to a different connection. For example, an interposer 1200 may couple an integrated circuit die to a ball grid array (BGA) 1206 that can subsequently be coupled to the second substrate 1204. In some embodiments, the first and second substrates 1202/1204 are attached to opposing sides of the interposer 1200. In other embodiments, the first and second substrates 1202/1204 are attached to the same side of the interposer 1200. And in further embodiments, three or more substrates are interconnected by way of the interposer 1200.

The interposer 1200 may be formed of an epoxy resin, a fiberglass-reinforced epoxy resin, a ceramic material, or a polymer material such as polyimide. In further implementations, the interposer 1200 may be formed of alternate rigid or flexible materials that may include the same materials described above for use in a semiconductor substrate, such as silicon, germanium, and other group III-V and group IV materials.

The interposer 1200 may include metal interconnects 1208 and vias 1210, including but not limited to through-silicon vias (TSVs) 1212. The interposer 1200 may further include embedded devices 1214, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1200. In accordance with embodiments of the disclosure, apparatuses or processes disclosed herein may be used in the fabrication of interposer 1200 or in the fabrication of components included in the interposer 1200.

Figure 13:
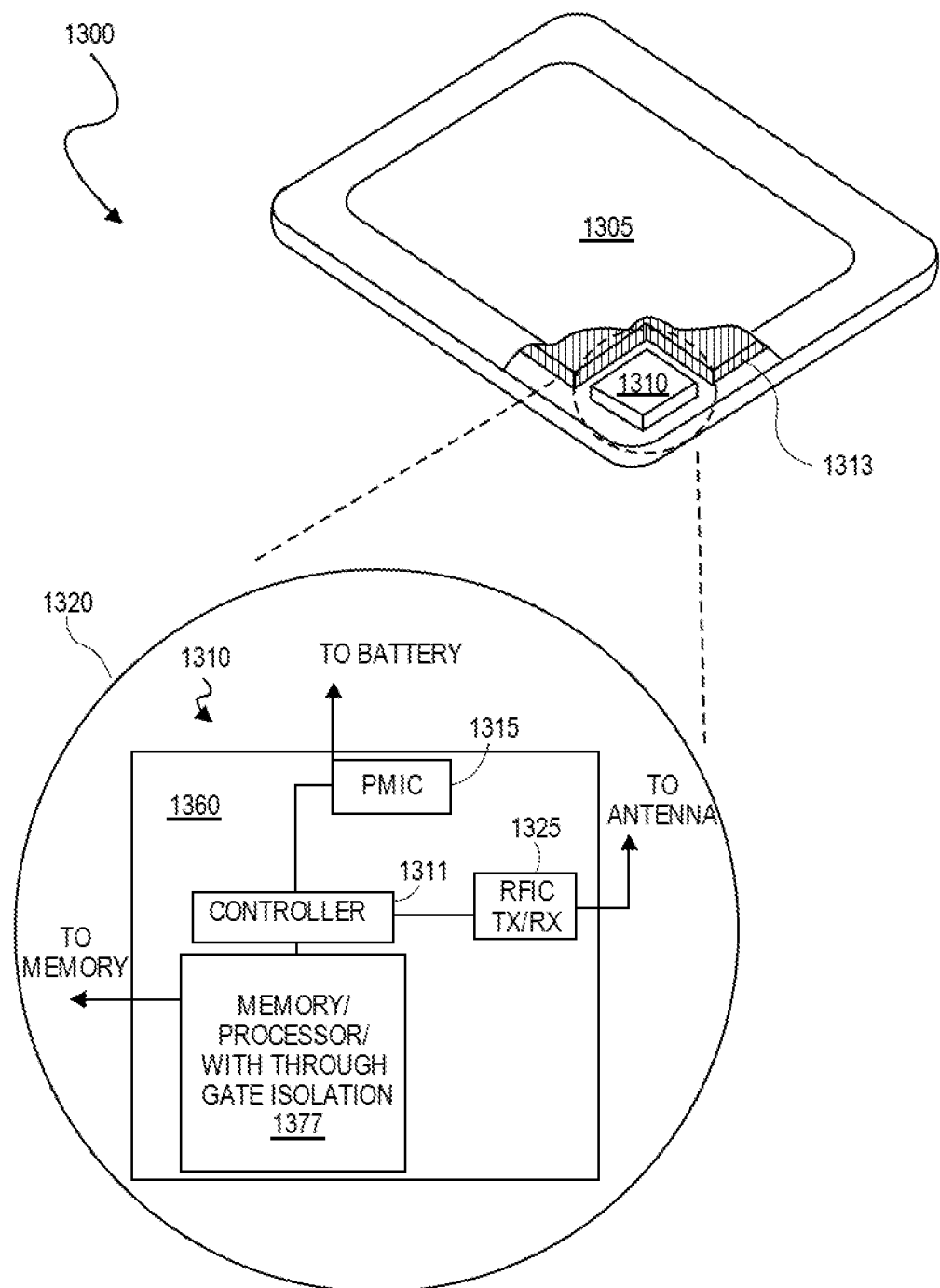
FIG. 13 is an isometric view of a mobile computing platform employing an IC fabricated according to one or more processes described herein or including one or more features described herein, in accordance with an embodiment of the present disclosure.

FIG. 13 is an isometric view of a mobile computing platform 1300 employing an integrated circuit (IC) fabricated according to one or more processes described herein or including one or more features described herein, in accordance with an embodiment of the present disclosure.

The mobile computing platform 1300 may be any portable device configured for each of electronic data display, electronic data processing, and wireless electronic data transmission. For example, mobile computing platform 1300 may be any of a tablet, a smart phone, laptop computer, etc. and includes a display screen 1305 which in the exemplary embodiment is a touchscreen (capacitive, inductive, resistive, etc.), a chip-level (SoC) or package-level integrated system 1310, and a battery 1313. As illustrated, the greater the level of integration in the system 1310 enabled by higher transistor packing density, the greater the portion of the mobile computing platform 1300 that may be occupied by the battery 1313 or non-volatile storage, such as a solid state drive, or the greater the transistor gate count for improved platform functionality. Similarly, the greater the carrier mobility of each transistor in the system 1310, the greater the functionality. As such, techniques described herein may enable performance and form factor improvements in the mobile computing platform 1300.

The integrated system 1310 is further illustrated in the expanded view 1320. In the exemplary embodiment, packaged device 1377 includes at least one memory chip (e.g., RAM), or at least one processor chip (e.g., a multi-core microprocessor and/or graphics processor) fabricated according to one or more processes described herein or including one or more features described herein. The packaged device 1377 is further coupled to the board 1360 along with one or more of a power management integrated circuit (PMIC) 1315, RF (wireless) integrated circuit (RFIC) 1325 including a wideband RF (wireless) transmitter and/or receiver (e.g., including a digital baseband and an analog front end module further includes a power amplifier on a transmit path and a low noise amplifier on a receive path), and a controller thereof 1311. Functionally, the PMIC 1315 performs battery power regulation, DC-to-DC conversion, etc., and so has an input coupled to the battery 1313 and with an output providing a current supply to all the other functional modules. As further illustrated, in the exemplary embodiment, the RFIC 1325 has an output coupled to an antenna to provide to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of the packaged device 1377 or within a single IC (SoC) coupled to the package substrate of the packaged device 1377.

In another aspect, semiconductor packages are used for protecting an integrated circuit (IC) chip or die, and also to provide the die with an electrical interface to external circuitry. With the increasing demand for smaller electronic devices, semiconductor packages are designed to be even more compact and must support larger circuit density. Furthermore, the demand for higher performance devices results in a need for an improved semiconductor package that enables a thin packaging profile and low overall warpage compatible with subsequent assembly processing.

In an embodiment, wire bonding to a ceramic or organic package substrate is used. In another embodiment, a C4 process is used to mount a die to a ceramic or organic package substrate. In particular, C4 solder ball connections can be implemented to provide flip chip interconnections between semiconductor devices and substrates. A flip chip or Controlled Collapse Chip Connection (C4) is a type of mounting used for semiconductor devices, such as integrated circuit (IC) chips, MEMS or components, which utilizes solder bumps instead of wire bonds. The solder bumps are deposited on the C4 pads, located on the top side of the substrate package. In order to mount the semiconductor device to the substrate, it is flipped over with the active side facing down on the mounting area. The solder bumps are used to connect the semiconductor device directly to the substrate.

Processing a flip chip may be similar to conventional IC fabrication, with a few additional operations. Near the end of the manufacturing process, the attachment pads are metalized to make them more receptive to solder. This typically consists of several treatments. A small dot of solder is then deposited on each metalized pad. The chips are then cut out of the wafer as normal. To attach the flip chip into a circuit, the chip is inverted to bring the solder dots down onto connectors on the underlying electronics or circuit board. The solder is then re-melted to produce an electrical connection, typically using an ultrasonic or alternatively reflow solder process. This also leaves a small space between the chip's circuitry and the underlying mounting. In most cases an electrically-insulating adhesive is then "underfilled" to provide a stronger mechanical connection, provide a heat bridge, and to ensure the solder joints are not stressed due to differential heating of the chip and the rest of the system.

In other embodiments, newer packaging and die-to-die interconnect approaches, such as through silicon via (TSV)

and silicon interposer, are implemented to fabricate high performance Multi-Chip Module (MCM) and System in Package (SiP) incorporating an integrated circuit (IC) fabricated according to one or more processes described herein or including one or more features described herein, in accordance with an embodiment of the present disclosure.

Thus, embodiments of the present disclosure include gallium nitride (GaN) integrated circuit technology.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of the present disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of the present application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

The following examples pertain to further embodiments. The various features of the different embodiments may be variously combined with some features included and others excluded to suit a variety of different applications.

Example embodiment 1: An integrated circuit structure includes a substrate including silicon, the substrate having a top surface. A first trench is in the substrate, the first trench having a first width. A second trench is in the substrate, the second trench having a second width less than the first width. A first island is in the first trench, the first island including gallium and nitrogen and having first corner facets below the top surface of the substrate. A second island is in the second trench, the second island including gallium and nitrogen and having second corner facets below the top surface of the substrate.

Example embodiment 2: The integrated circuit structure of example embodiment 1, further including a hardmask material adjacent to the first corner facets and the second corner facets.

Example embodiment 3: The integrated circuit structure of example embodiment 1, wherein the hardmask material includes silicon and nitrogen.

Example embodiment 4: The integrated circuit structure of example embodiment 1, 2 or 3, wherein the first island has a top surface co-planar with the top surface of the substrate, and wherein the second island has a top surface co-planar with the top surface of the substrate.

Example embodiment 5: The integrated circuit structure of example embodiment 1, 2, 3 or 4, further including a plurality of gate structures over the first island or the second island, a source region on a first side of the plurality of gate structures, a drain region on a second side of the plurality of gate structures, the second side opposite the first side, and a drain field plate above the drain region wherein the drain field plate is coupled to the source region.

Example embodiment 6: A computing device includes a board, and a component coupled to the board. The component includes an integrated circuit structure including a substrate including silicon, the substrate having a top surface. A first trench is in the substrate, the first trench having a first width. A second trench is in the substrate, the second trench having a second width less than the first width. A first island is in the first trench, the first island including gallium and nitrogen and having first corner facets below the top surface of the substrate. A second island is in the second trench, the second island including gallium and nitrogen and having second corner facets below the top surface of the substrate.

Example embodiment 7: The computing device of example embodiment 6, further including a memory coupled to the board.

Example embodiment 8: The computing device of example embodiment 6 or 7, further including a communication chip coupled to the board.

Example embodiment 9: The computing device of example embodiment 6, 7 or 8, further including a camera coupled to the board.

Example embodiment 10: The computing device of example embodiment 6, 7, 8 or 9, wherein the component is a packaged integrated circuit die.

Example embodiment 11: An integrated circuit structure includes a fin, the fin including gallium and nitrogen. The integrated circuit structure includes a nanowire including silicon. The nanowire is vertically over the fin. A gate structure is around the nanowire and over the fin. The gate structure includes an N-type gate electrode layer over the fin, and the gate structure includes a P-type gate electrode layer around the nanowire.

Example embodiment 12: The integrated circuit structure of example embodiment 11, wherein the gate structure includes a conductive gate fill material continuous between the N-type gate electrode layer and the P-type gate electrode layer.

Example embodiment 13: The integrated circuit structure of example embodiment 11, wherein the gate structure includes a conductive gate fill material non-continuous between the N-type gate electrode layer and the P-type gate electrode layer.

Example embodiment 14: The integrated circuit structure of example embodiment 11, 12 or 13, further including an isolation layer between the nanowire and the fin.

Example embodiment 15: The integrated circuit structure of example embodiment 11, 12 or 13, wherein there is no isolation layer between the nanowire and the fin.

Example embodiment 16: A computing device includes a board, and a component coupled to the board. The component includes an integrated circuit structure including a fin, the fin including gallium and nitrogen. The integrated circuit structure includes a nanowire including silicon. The nanowire is vertically over the fin. A gate structure is around the nanowire and over the fin. The gate structure includes an N-type gate electrode layer over the fin, and the gate structure includes a P-type gate electrode layer around the nanowire.

Example embodiment 17: The computing device of example embodiment 16, further including a memory coupled to the board.

Example embodiment 18: The computing device of example embodiment 16 or 17, further including a communication chip coupled to the board.

Example embodiment 19: The computing device of example embodiment 16, 17 or 18, further including a camera coupled to the board.

Example embodiment 20: The computing device of example embodiment 16, 17, 18 or 19, wherein the component is a packaged integrated circuit die.

What is claimed is:

1. An integrated circuit structure, comprising:
   a substrate comprising silicon, the substrate having a top surface;
   a first trench in the substrate, the first trench having a first width;
   a second trench in the substrate, the second trench having a second width less than the first width;
   a first island in the first trench, the first island comprising gallium and nitrogen and having first corner facets below the top surface of the substrate;
   a second island in the second trench, the second island comprising gallium and nitrogen and having second corner facets below the top surface of the substrate; and
   a hardmask material adjacent to the first corner facets and the second corner facets.

2. The integrated circuit structure of claim 1, wherein the hardmask material comprises silicon and nitrogen.

3. The integrated circuit structure of claim 1, wherein the first island has a top surface co-planar with the top surface of the substrate, and wherein the second island has a top surface co-planar with the top surface of the substrate.

4. The integrated circuit structure of claim 1, further comprising
   a plurality of gate structures over the first island or the second island;
   a source region on a first side of the plurality of gate structures;
   a drain region on a second side of the plurality of gate structures, the second side opposite the first side; and
   a drain field plate above the drain region wherein the drain field plate is coupled to the source region.

5. A computing device, comprising:
   a board; and
   a component coupled to the board, the component including an integrated circuit structure, comprising:
   a substrate comprising silicon, the substrate having a top surface;
   a first trench in the substrate, the first trench having a first width;
   a second trench in the substrate, the second trench having a second width less than the first width;
   a first island in the first trench, the first island comprising gallium and nitrogen and having first corner facets below the top surface of the substrate;
   a second island in the second trench, the second island comprising gallium and nitrogen and having second corner facets below the top surface of the substrate; and
   a hardmask material adjacent to the first corner facets and the second corner facets.

6. The computing device of claim 5, further comprising:
   a memory coupled to the board.

7. The computing device of claim 5, further comprising:
   a communication chip coupled to the board.

8. The computing device of claim 5, further comprising:
   a camera coupled to the board.

9. The computing device of claim 5, wherein the component is a packaged integrated circuit die.

10. An integrated circuit structure, comprising:
    a fin, the fin comprising gallium and nitrogen;
    a nanowire comprising silicon, the nanowire vertically over the fin;
    a gate structure around the nanowire and over the fin, the gate structure comprising an N-type gate electrode layer over the fin, and the gate structure comprising a P-type gate electrode layer around the nanowire.

11. The integrated circuit structure of claim 10, wherein the gate structure includes a conductive gate fill material continuous between the N-type gate electrode layer and the P-type gate electrode layer.

12. The integrated circuit structure of claim 10, wherein the gate structure includes a conductive gate fill material non-continuous between the N-type gate electrode layer and the P-type gate electrode layer.

13. The integrated circuit structure of claim 10, further comprising an isolation layer between the nanowire and the fin.

14. The integrated circuit structure of claim 10, wherein there is no isolation layer between the nanowire and the fin.

15. A computing device, comprising:
    a board; and
    a component coupled to the board, the component including an integrated circuit structure, comprising:
    a fin, the fin comprising gallium and nitrogen;
    a nanowire comprising silicon, the nanowire vertically over the fin;
    a gate structure around the nanowire and over the fin, the gate structure comprising an N-type gate electrode layer over the fin, and the gate structure comprising a P-type gate electrode layer around the nanowire.

16. The computing device of claim 15, further comprising:
    a memory coupled to the board.

17. The computing device of claim 15, further comprising:
    a communication chip coupled to the board.

18. The computing device of claim 15, further comprising:
    a camera coupled to the board.

19. The computing device of claim 15, wherein the component is a packaged integrated circuit die.

* * * * *